(12) United States Patent
Komatsubara et al.

(10) Patent No.: US 6,841,737 B2
(45) Date of Patent: Jan. 11, 2005

(54) WIRED CIRCUIT BOARD

(75) Inventors: Makoto Komatsubara, Osaka (JP); Shigenori Morita, Osaka (JP); Tadao Ookawa, Osaka (JP); Toshio Shintani, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/195,392

(22) Filed: Jul. 16, 2002

(65) Prior Publication Data

US 2003/0026078 A1 Feb. 6, 2003

(30) Foreign Application Priority Data

Jul. 17, 2001  (JP) .......................................... 2001-216812

(51) Int. Cl.[7] .............................................. H05K 7/06
(52) U.S. Cl. ........................ 174/250; 174/255; 174/257; 174/258
(58) Field of Search ................................ 361/749–751; 174/254, 250, 255–258, 261

(56) References Cited

U.S. PATENT DOCUMENTS

| | | | | |
|---|---|---|---|---|
| 3,711,626 A | * | 1/1973 | Kilby et al. | 174/251 |
| 5,446,245 A | * | 8/1995 | Iwayama et al. | 174/261 |
| 6,388,201 B2 | * | 5/2002 | Yamato et al. | 174/255 |
| 6,399,899 B1 | * | 6/2002 | Ohkawa et al. | 174/261 |

* cited by examiner

*Primary Examiner*—John B. Vigushin
(74) *Attorney, Agent, or Firm*—Jean C. Edwards, Esq.; Dickinson Wright PLLC

(57) ABSTRACT

A wired circuit board having a terminal portion formed as a flying lead that can provide enhanced strength of the conductive pattern, both sides of which are exposed, by simple construction to effectively prevent disconnection of the conductive pattern. The wired circuit board having the terminal portion formed as the flying lead in which the both sides of the conductive pattern are exposed includes, in crossing areas where ends of a cover-side opening and ends of a base-side opening and the conductive pattern are crossed each other, (i) the widened portions formed in the conductive pattern or (ii) cover-side projections and base-side projections formed in the cover layer and the base layer, respectively.

7 Claims, 15 Drawing Sheets

(a)

(b)

(a)

(b)

FIG. 12
(a)
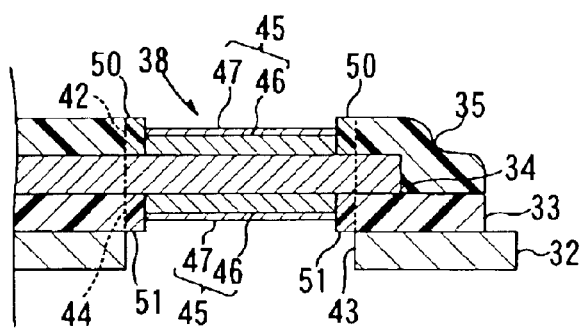
(b)
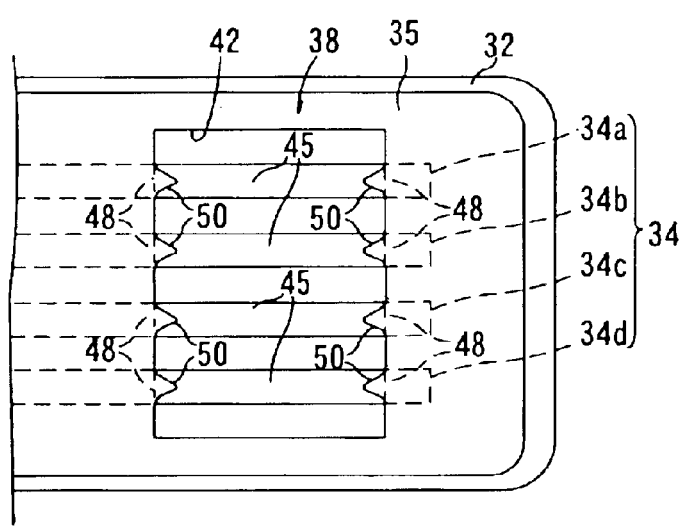

F I G. 1 8
(a)
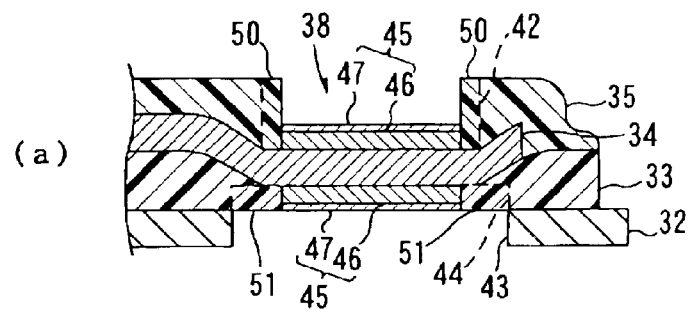
(b)
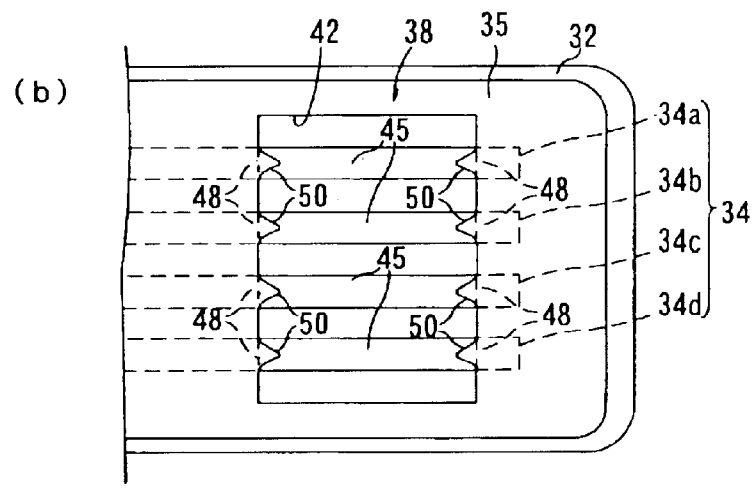

FIG. 21
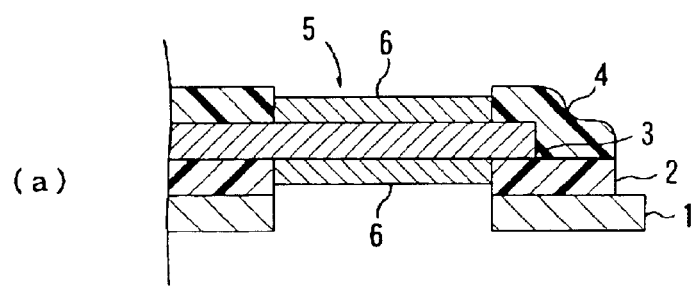
(a)
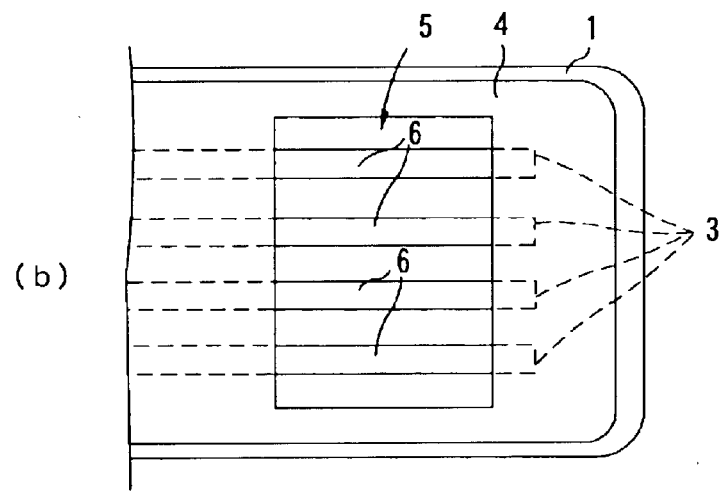
(b)

WIRED CIRCUIT BOARD

The present invention claims priority from Japanese Patent Application Serial No. 2001-21812 filed Jul. 17, 2001, which is herein incorporated by reference.

BACKGROUND OF THE INVENTION

1. Field of the Invention

The present invention relates to a wired circuit board and, more particularly, to a wired circuit board suitably used for a suspension board with circuit.

2. Description of the Prior Art

The wired circuit boards used for electronic/electric equipment are usually provided with terminal portions to connect with external connecting terminals.

In recent years, the so-called "flying lead" in which the terminal portions are formed on both sides of the conductive pattern, rather than in only either side thereof, is in widespread use in order to meet the demand for electronic/electric equipment to have increasingly higher density and reduced size. It is known, for example, in a suspension board with circuit used for a hard disk drive that the terminals are provided in the form of flying lead.

To be more specific, the suspension board with circuit comprises a supporting board 1 of stainless steel foil, a base layer 2 of an insulating material formed on the supporting board 1, a conductive pattern 3 formed on the base layer 2 in the form of a specified circuit pattern, and a cover layer 4 of an insulating material, for covering the conductive pattern 3, as shown in FIG. 21. The terminal portions 5 provided in the form of the flying lead are formed on both sides of the conductive pattern 3 in the following manner. The cover layer 4 is opened to expose a front side of the conductive pattern 3, while also the supporting board 1 and the base layer 2 are opened to expose a back side of the conductive pattern 3. If necessary, metal plated layers 6 are formed on the both sides of the thus exposed conductive pattern 3 by nickel/gold plating and the like.

Thereafter, these terminal portions formed as the flying lead are bonded to external connecting terminals by applying supersonic vibration thereto by use of a bonding tool and the like.

In this terminal portion formed as the flying lead, since the both sides of the conductive pattern are exposed, the supersonic vibration is easily transmitted to the terminals. This is suitable for the bonding using the supersonic vibration: on the other hand, this provides the disadvantage that the conductive pattern exposed at both sides thereof is weak in physical strength and is subject to stress concentration at edge portions of the openings in the base layer and cover layer, to cause easy disconnection of the conductive pattern.

SUMMARY OF THE INVENTION

It is the object of the invention to provide a new wired circuit board having a terminal portion formed as a flying lead in which both sides of a conductive pattern are exposed that can provide enhanced strength of the conductive pattern by simple construction to effectively prevent the occurrence of disconnection of the conductive pattern.

The present invention provides a wired circuit board comprising a first insulating layer, a conductive pattern formed on the first insulating layer, a second insulating layer formed on the conductive pattern, and an opening, formed at the same position of the conductive pattern, for allowing the first insulating layer and the second insulating layer to open, so as to form a terminal portion in which front and back sides of the conductive pattern are exposed, wherein at least any one of the first insulating layer, the second insulating layer and the conductive pattern has reinforcing portions for reinforcing the conductive pattern formed at ends of the opening in crossing areas where ends of the opening and the conductive pattern cross each other.

Also, the present invention provides a wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein at least any one of the first insulating layer, the second insulating layer and the conductive pattern has reinforcing portions for reinforcing the conductive pattern formed at ends of the opening in crossing areas where ends of the opening and the conductive pattern cross each other.

In the wired circuit boards mentioned above, since at least any one of the first insulating layer, the second insulating layer and the conductive pattern has the reinforcing portions for reinforcing the conductive pattern formed at the ends of the opening in the crossing areas where the ends of the opening and the conductive pattern cross each other, the physical strength of the conductive pattern at the ends of the opening can be reinforced. This can produce the effect that for example, when the conductive pattern, both sides of which are exposed, is subject to stress concentration at the end portions of the opening in the process of bonding the terminal portion and the external connecting terminal by applying supersonic vibration of a bonding tool, the disconnection of the conductive pattern can be effectively prevented, thus providing improved bonding reliability.

In addition, the present invention provides a wired circuit board comprising a first insulating layer, a conductive pattern formed on the first insulating layer, a second insulating layer formed on the conductive pattern, and an opening, formed at the same position of the conductive pattern, for allowing the first insulating layer and the second insulating layer to open, so as to form a terminal portion in which front and back sides of the conductive pattern are exposed, wherein the conductive pattern has widened portions formed to extend in a widthwise direction substantially orthogonal to an extending direction of the conductive pattern in crossing areas where ends of the opening and the conductive pattern cross each other.

Also, the present invention provides a wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein the conductive pattern has widened portions formed to extend in a widthwise direction substantially orthogonal to an extending direction of the conductive pattern in crossing areas where ends of the opening and the conductive pattern cross each other.

In the wired circuit boards mentioned above, since the conductive pattern has widened portions formed to extend in a widthwise direction substantially orthogonal to the extending direction of the conductive pattern in the crossing areas where the ends of the opening and the conductive pattern cross each other, the physical strength of the conductive pattern at the ends of the opening can be reinforced. This can produce the effect that for example when the conductive pattern both sides of which are exposed is subject to stress concentration at the end portions of the opening in the process of bonding the terminal portion and the external connecting terminal by applying supersonic vibration of the bonding tool, the disconnection of the conductive pattern can be effectively prevented, thus providing improved bonding reliability.

Further, the present invention provides a wired circuit board comprising a first insulating layer, a conductive pattern formed on the first insulating layer, a second insulating layer formed on the conductive pattern, and an opening, formed at the same position of the conductive pattern, for allowing the first insulating layer and the second insulating layer to open, so as to form a terminal portion in which front and back sides of the conductive pattern are exposed, wherein the first insulating layer and/or the second insulating layer have projections projecting from ends of the opening onto the conductive pattern in the opening in the crossing areas where the ends of the opening and the conductive pattern cross each other.

Also, the present invention provides a wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein the first insulating layer and/or the second insulating layer have projections projecting from ends of the opening onto the conductive pattern in the opening in the crossing areas where the ends of the opening and the conductive pattern cross each other.

In the wired circuit boards mentioned above, since the first insulating layer and/or the second insulating layer have projections projecting from the ends of the opening onto the conductive pattern in the opening in the crossing areas where the ends of the opening and the conductive pattern cross each other, the physical strength of the conductive pattern at the ends of the opening can be reinforced. This can produce the effect that for example when the conductive pattern both sides of which are exposed is subject to stress concentration at the end portions of the opening in the process of bonding the terminal portion and the external connecting terminal by applying supersonic vibration of the bonding tool, the disconnection of the conductive pattern can be effectively prevented, thus providing improved bonding reliability.

The wired circuit board of the present invention can provide high bonding reliability so that the wired circuit board can be used as the suspension board with circuit, even when formed as the flying lead in which both sides of the conductive pattern are exposed.

(a) shows the step of forming a conductive pattern on a base layer;

(b) shows the step of forming a base layer on the conductive pattern;

(c) shows the step of forming a cover-side opening on the cover layer at a portion thereof at which terminals are to be formed;

(d) shows the step of forming a base-side opening on the base layer at a portion thereof at which terminals are to be formed; and (e) shows the step of forming a metal plated layer on each of front and back sides of the conductive pattern exposed in the cover-side opening and the base-side opening.

Figure 4:
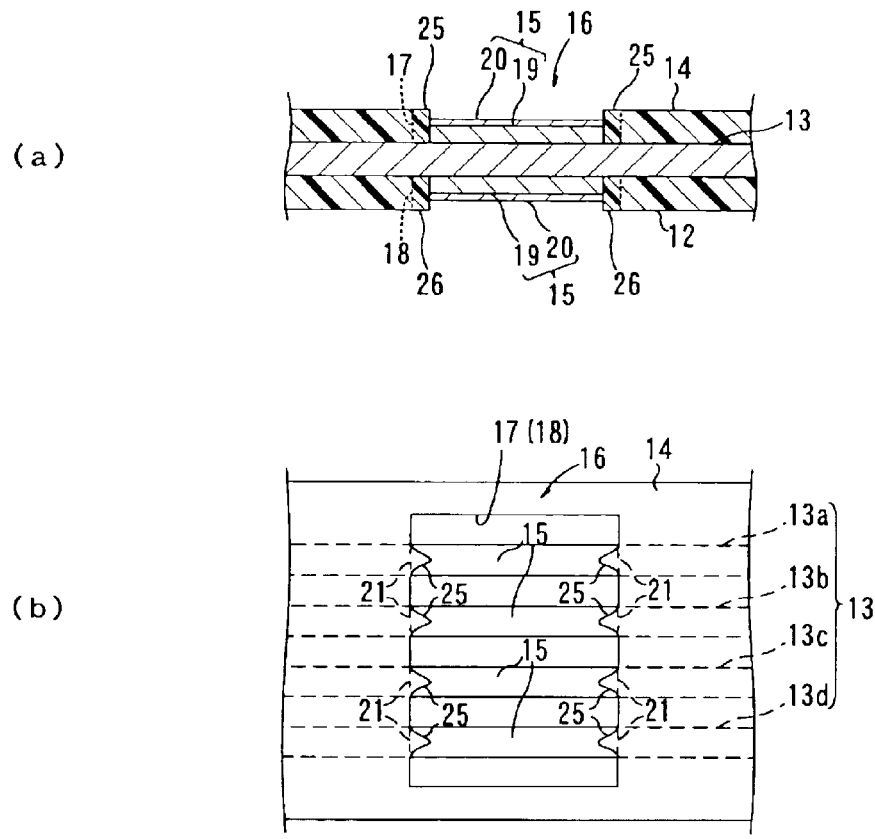

FIG. 4 shows another embodiment of the wired circuit board (wherein a cover-side projection and a base-side projection are formed) of the present invention: (a) is a sectional view of a principal portion of a terminal portion of the wired circuit board; and (b) is a plan view of the terminal portion of the same.

Figure 5:
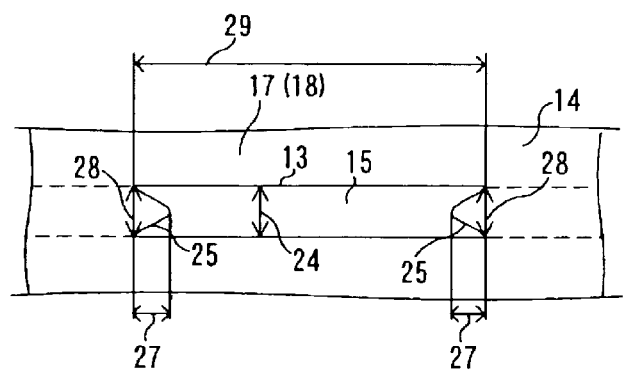

FIG. 5 is an enlarged view of the plan view shown in FIG. 4(b).

Figure 6:
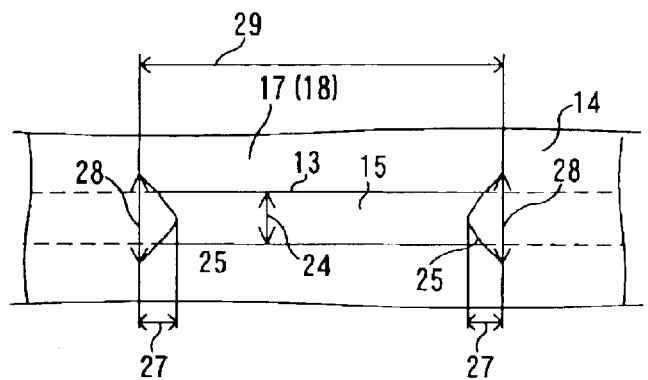

FIG. 6 is an enlarged view of the plane view of another embodiment shown in FIG. 4(b).

Figure 7:
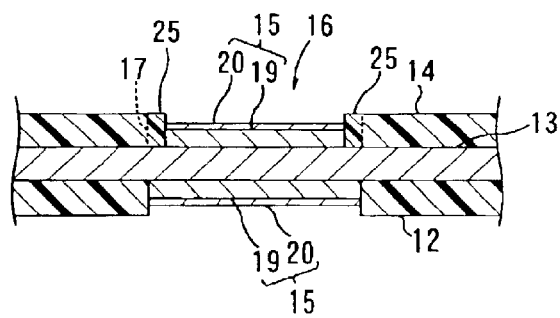

FIG. 7 shows in section a principal portion of another embodiment (only the cover-side projection is formed) of the wired circuit board shown in FIG. 4(a).

Figure 8:
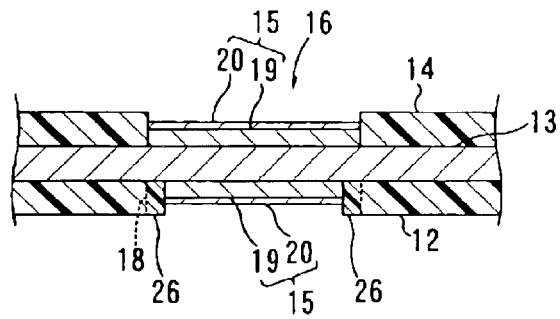

FIG. 8 shows in section a principal portion of still another embodiment (only the base-side projection is formed) of the wired circuit board shown in FIG. 4(a).

Figure 9:
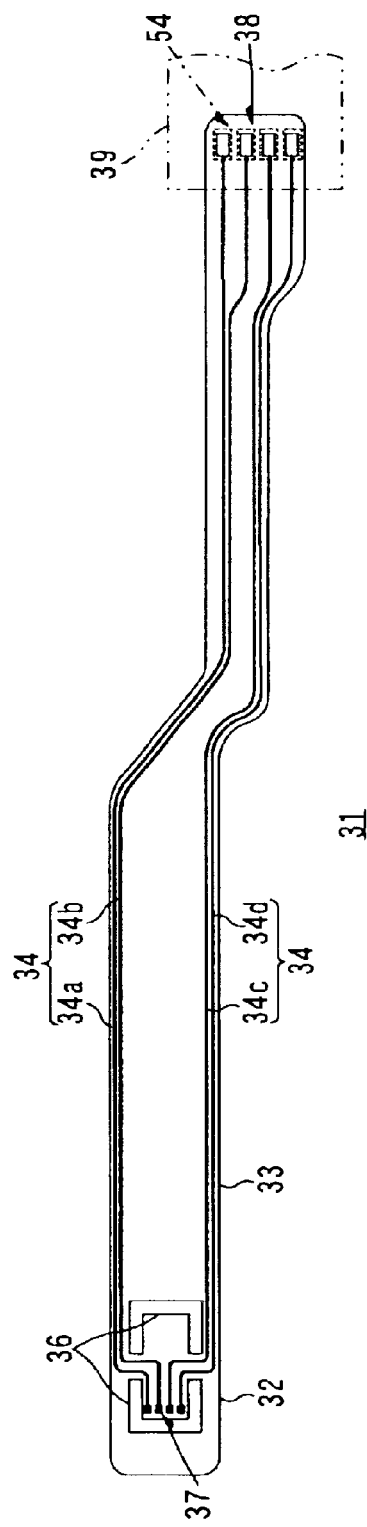

FIG. 9 is a plan view of a suspension board with circuit presented as one embodiment of the wired circuit board of the present invention.

Figure 10:
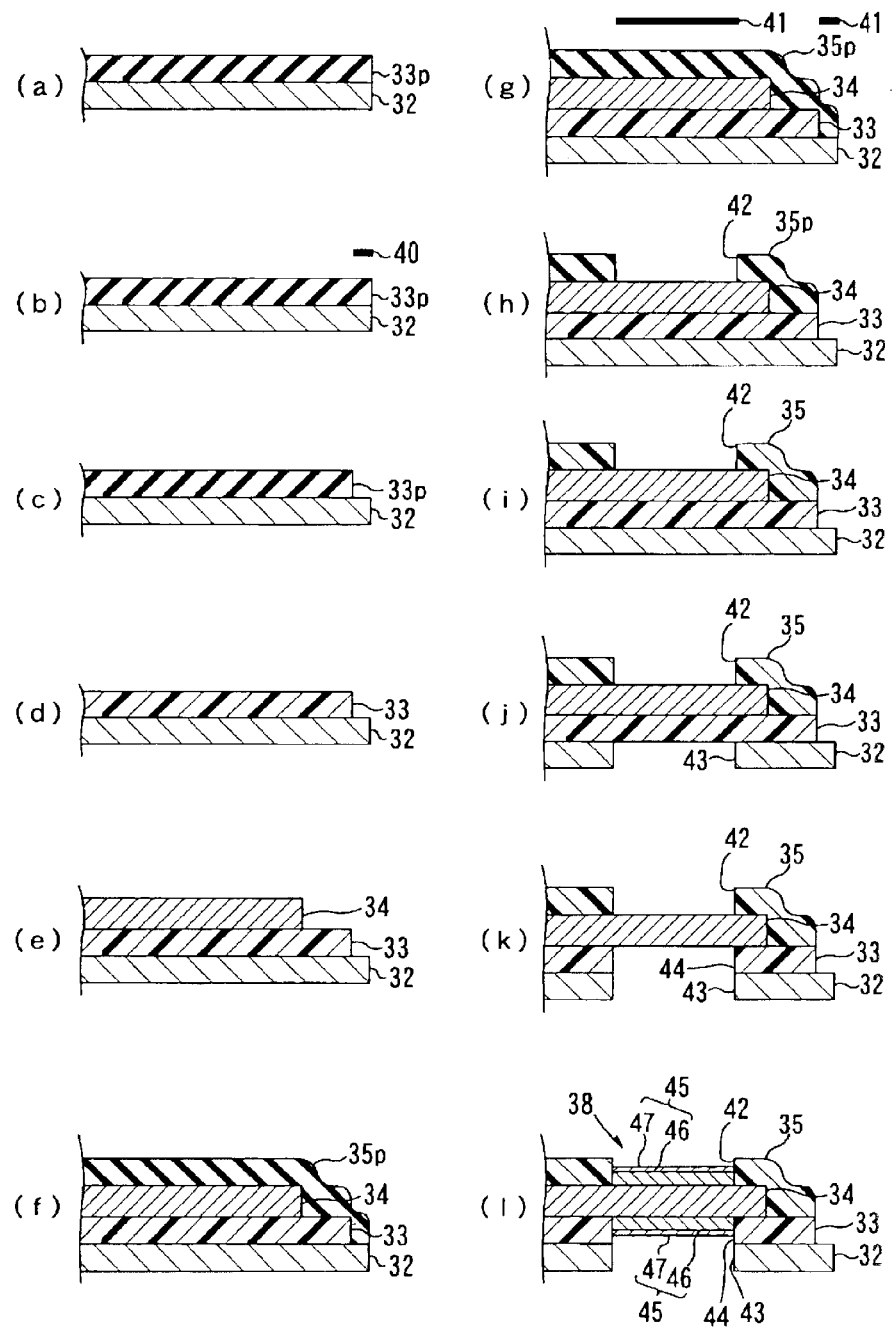

FIG. 10 illustrates the production processes of the suspension board with circuit shown in FIG. 9:

(a) shows the step of forming a coating of a precursor of a photosensitive polyimide resin on a supporting board;

(b) shows the step of exposing the coating to light through a photomask;

(c) shows the step of developing the coating to form it into a predetermined pattern;

(d) shows the step of curing the patterned coating to form the base layer, (e) shows the step of forming a conductive pattern on the base layer;

(f) shows the step of forming a coating of a precursor of a photosensitive polyimide resin on the conductive pattern;

(g) shows the step of exposing the coating to light through a photomask;

(h) shows the step of developing the coating to form it into a predetermined pattern;

(i) shows the step of curing the patterned coating to form the cover layer;

(j) shows the step of opening the supporting board at portions thereof at which the external-side connecting terminals are formed;

(k) shows the step of opening the base layer at portions thereof at which the external-side connecting terminals are formed; and (l) shows the step of forming a metal plated layer on each side of the exposed conductive pattern.

Figure 11:
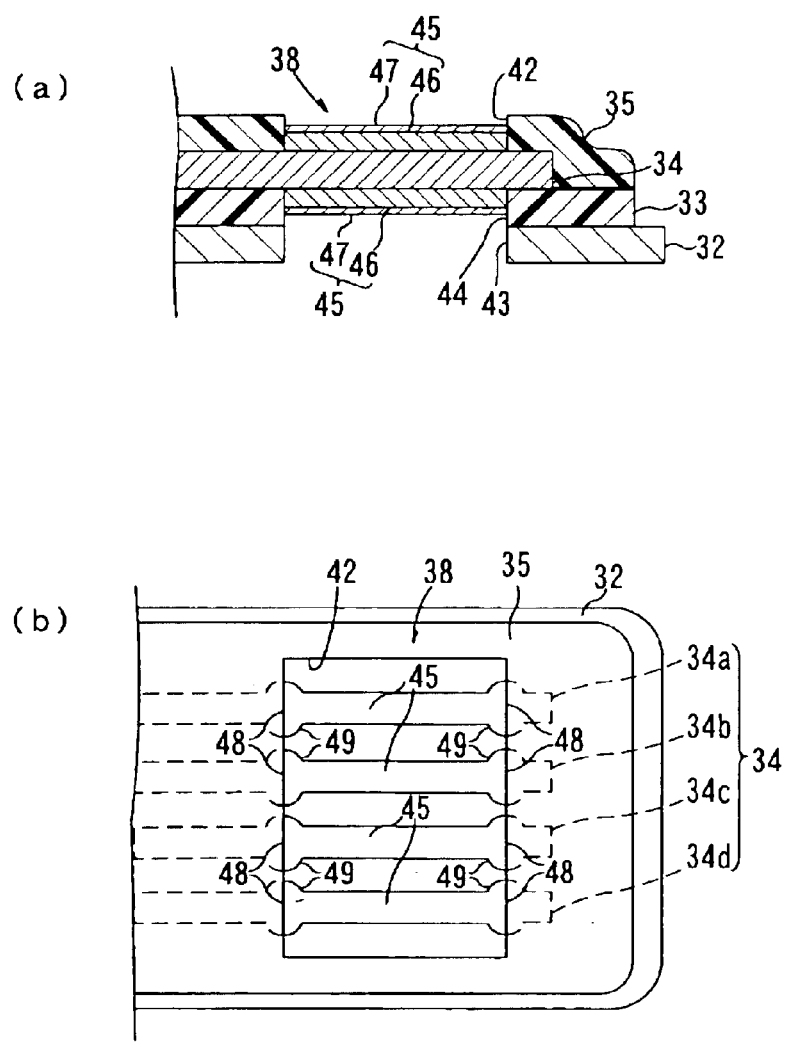

FIG. 11 shows an embodiment of a suspension board with circuit shown in FIG. 9 (wherein a widened portion is formed) of the present invention: (a) is a sectional view of a principal portion of an external-side connecting terminal of the suspension board with circuit; and (b) is a plan view of the external-side connecting terminal of the same.

FIG. 12 shows an embodiment of a suspension board with circuit shown in FIG. 9 (wherein a cover-side projection and a base-side projection are formed): (a) is a sectional view of a principal portion of an external-side connecting terminal of the suspension board with circuit; and (b) is a plan view of the external-side connecting terminal of the same.

Figure 13:
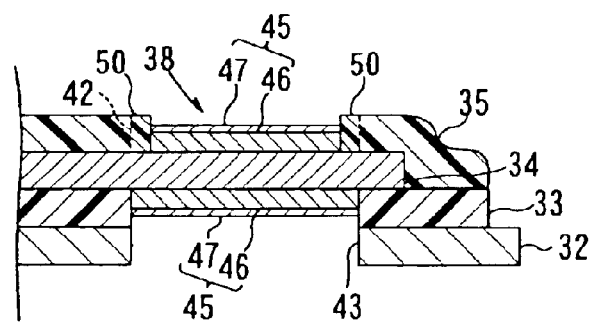

FIG. 13 shows in section a principal portion of another embodiment (only the cover-side projection is formed) of the suspension board with circuit shown in FIG. 12(a).

Figure 14:
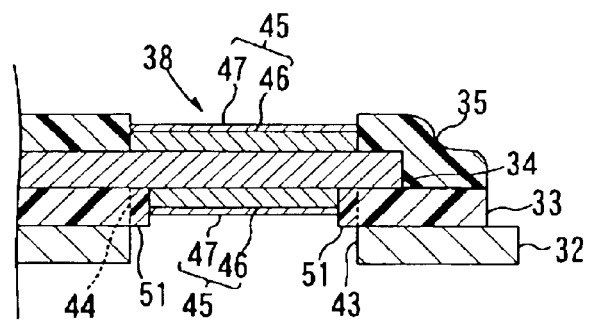

FIG. 14 shows in section a principal portion of still another embodiment (only the base-side projection is formed) of the suspension board with circuit shown in FIG. 12(a).

Figure 15:
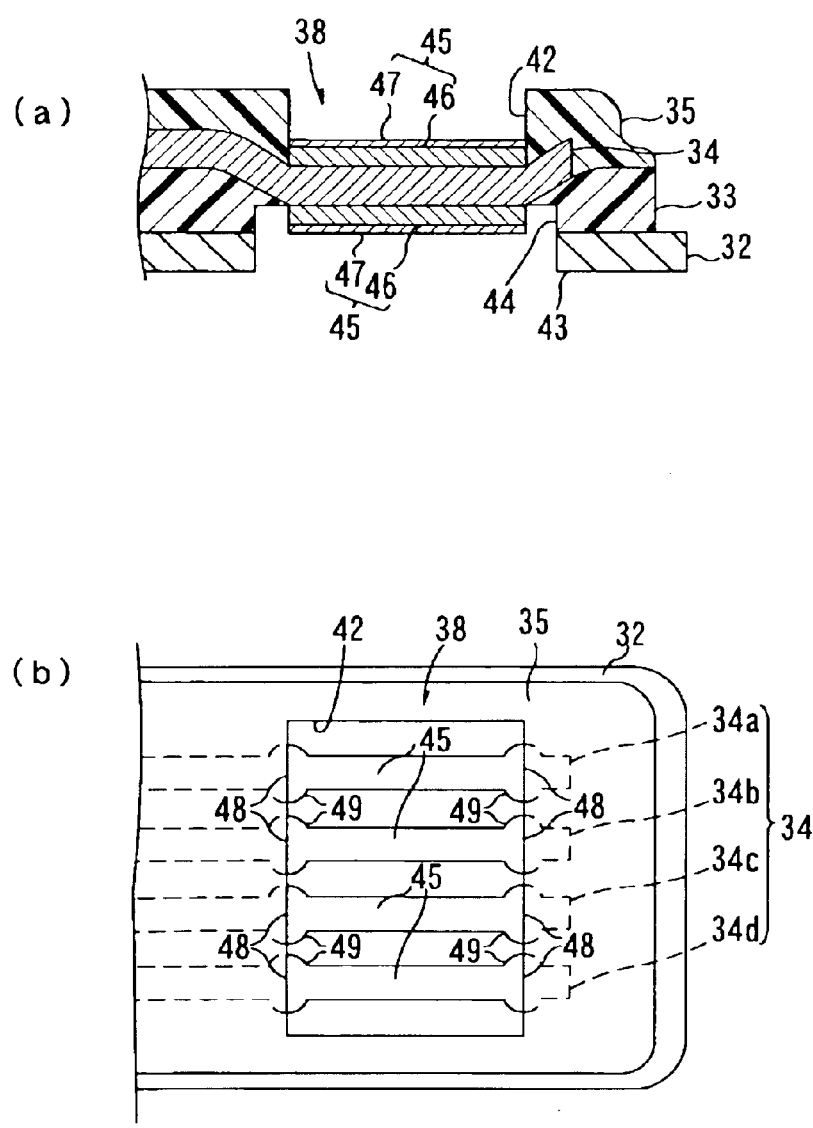

FIG. 15 shows an embodiment of a suspension board with circuit shown in FIG. 9 (wherein the conductive pattern has a concave form and a widened portion is formed): (a) is a sectional view of a principal portion of an external-side connecting terminal of the suspension board with circuit; and (b) is a plan view of the external-side connecting terminal of the same.

Figure 16:
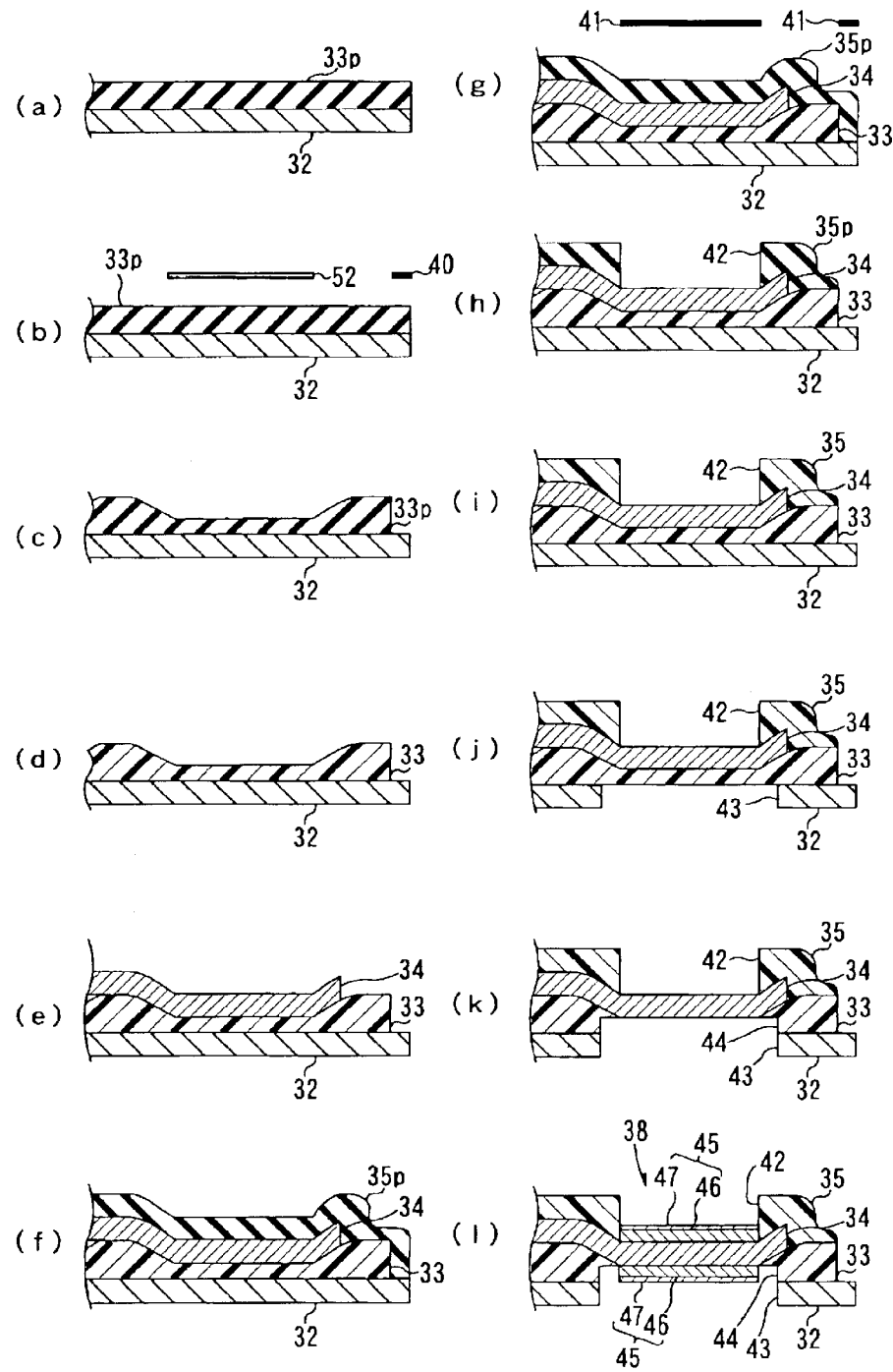

FIG. 16 illustrates the production processes of the suspension board with circuit shown in FIG. 15:

(a) shows the step of forming a coating of a precursor of a photosensitive polyimide resin on a supporting board;

(b) shows the step of exposing the coating to light through a photomask;

(c) shows the step of developing the coating to form it into a predetermined pattern;

(d) shows the step of curing the patterned coating to form the base layer, (e) shows the step of forming a conductive pattern on the base layer;

(f) shows the step of forming a coating of a precursor of a photosensitive polyimide resin on the conductive pattern;

(g) shows the step of exposing the coating to light through a photomask;

(h) shows the step of developing the coating to form it into a predetermined pattern;

(i) shows the step of curing the patterned coating to form the cover layer;

(j) shows the step of opening the supporting board at portions thereof at which the external-side connecting terminals are formed;

(k) shows the step of opening the base layer at portions thereof at which the external-side connecting terminals are formed; and (l) shows the step of forming a metal plated layer on each side of the exposed conductive pattern.

Figure 17:
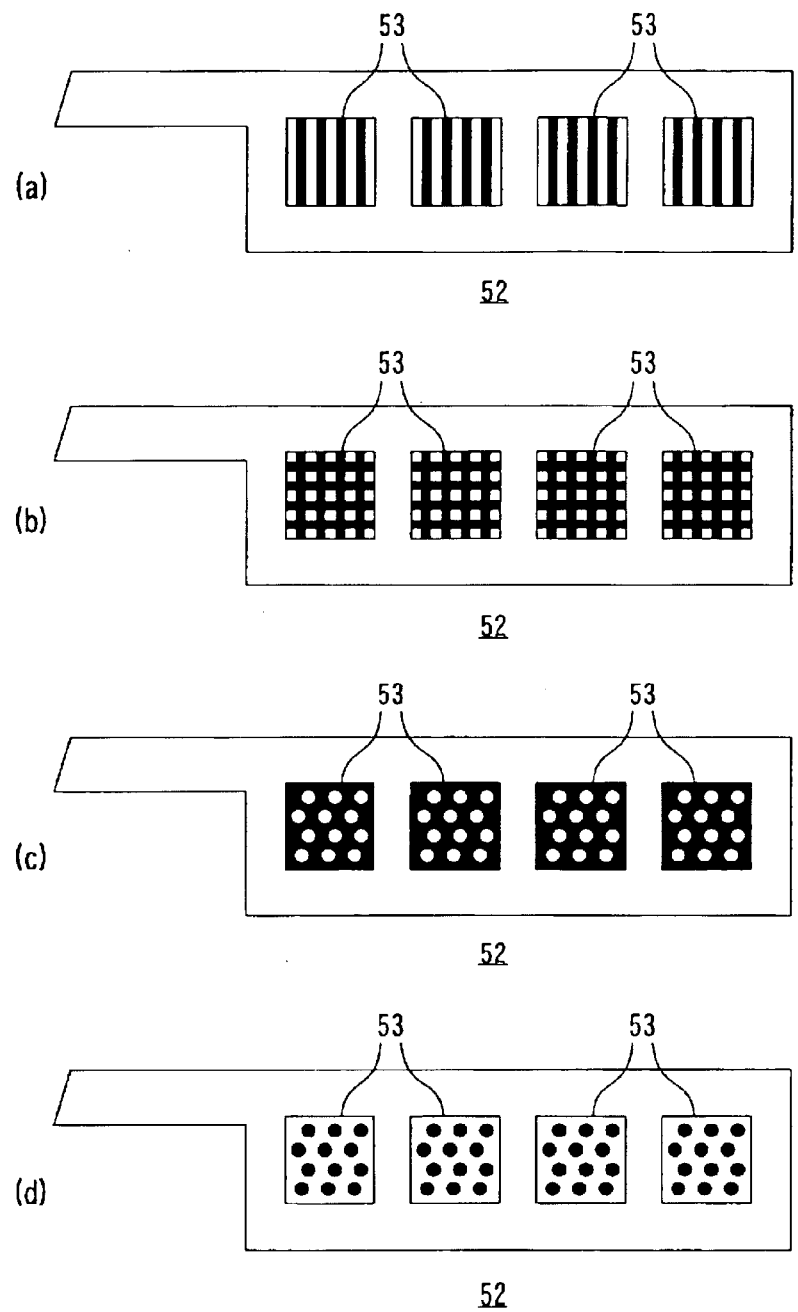

FIG. 17 is a schematic plan view of an embodiment of a photomask used for exposing the coating to light in the step of FIG. 16(b):

(a) shows a semi-translucent striped pattern having an average transmission ratio of about 50%;

(b) shows a semi-translucent latticed pattern having an average transmission ratio of about 25%;

(c) shows a semi-translucent circular staggered pattern having an average transmission ratio of about 25%; and (d) shows a semi-translucent circular staggered pattern having an average transmission ratio of about 70%.

FIG. 18 shows an embodiment of a suspension board with circuit shown in FIG. 9 (wherein the conductive pattern has a concave form and a cover-side projection and a base-side projection are formed): (a) is a sectional view of a principal portion of an external-side connecting terminal of the suspension board with circuit; and (b) is a plan view of the external-side connecting terminal of the same.

Figure 19:
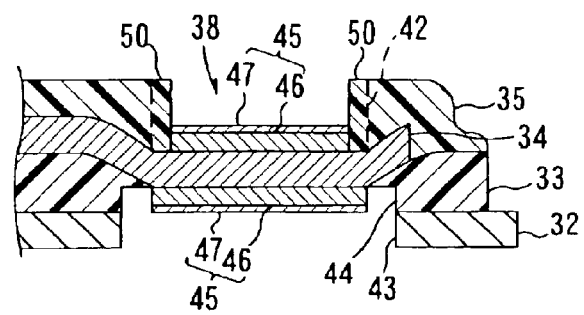

FIG. 19 shows in section a principal part of another embodiment of a suspension board with circuit shown in FIG. 18(a) (wherein only the cover-side projection is formed).

Figure 20:
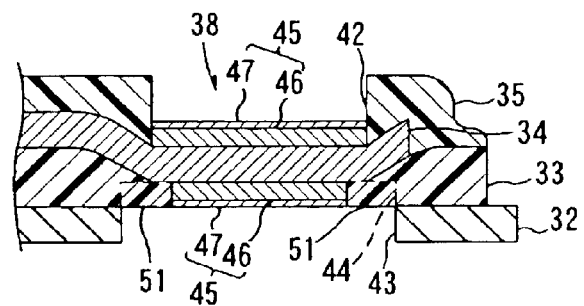

FIG. 20 shows in section a principal part of still another embodiment of a suspension board with circuit shown in FIG. 18(a) (wherein only the base-side projection is formed).

FIG. 21 shows a conventional suspension board with circuit: (a) is a sectional view of a principal portion of a terminal of the suspension board with circuit; and (b) is a plan view of the terminal of the same.

DETAILED DESCRIPTION OF THE PREFERRED EMBODIMENTS

Figure 1:
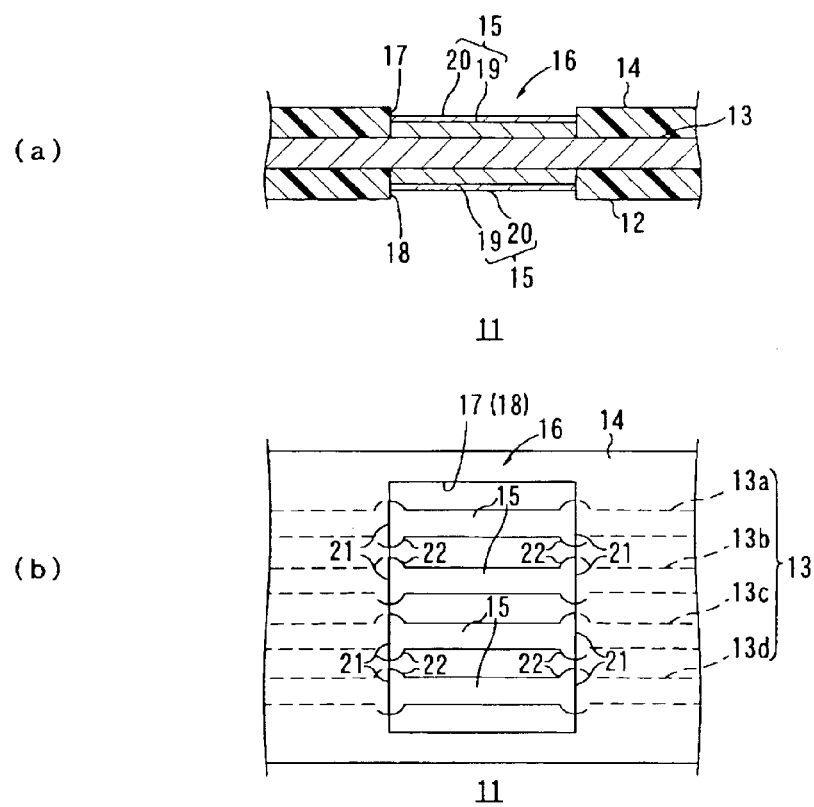
FIG. 1 shows an embodiment of a wired circuit board (wherein a widened portion is formed) of the present invention: (a) is a sectional view of a principal portion of a terminal portion of the wired circuit board; and (b) is a plan view of the terminal portion of the same.

Referring to FIG. 1, there is shown an embodiment of a wired circuit board of the present invention. FIG. 1(a) is a sectional view of a principal portion of a terminal portion of the wired circuit board; and FIG. 1(b) is a plan view of the terminal portion of the same. In FIG. 1(a), the wired circuit board 11 comprises a base layer 12 formed as a first insulating layer of insulating material, a conductive pattern 13 formed on the base layer 12 in the form of a specified wired circuit pattern, and a cover layer 14 formed as a second insulating layer of insulating material on the conductive pattern 13. The conductive pattern 13 is provided in the form of a plurality of lines of wires 13a, 13b, 13c and 13d arrayed in parallel with each other with spaced at a predetermined interval, as shown in FIG. 1(b).

The insulating materials of the base layer 12 and the cover layer 14 that may be used include, for example, synthetic resins, such as polyimide resin, acrylic resin, polyether nitrile resin, polyether sulfonic resin, polyethylene terephthalate resin, polyethylene naphthalate resin and polyvinyl chloride resin. Polyimide resin is preferably used.

The base layer 12 and the cover layer 14 usually have thickness of 1–30 $\mu$m, or preferably 2–20 $\mu$m.

The conductive materials used for the conductive pattern 13 include, for example, copper, nickel, gold, solder or alloys thereof. Copper is preferably used. The conductive pattern 13 usually has thickness of 2–30 $\mu$m, or preferably 5–20 $\mu$m.

Figure 3:
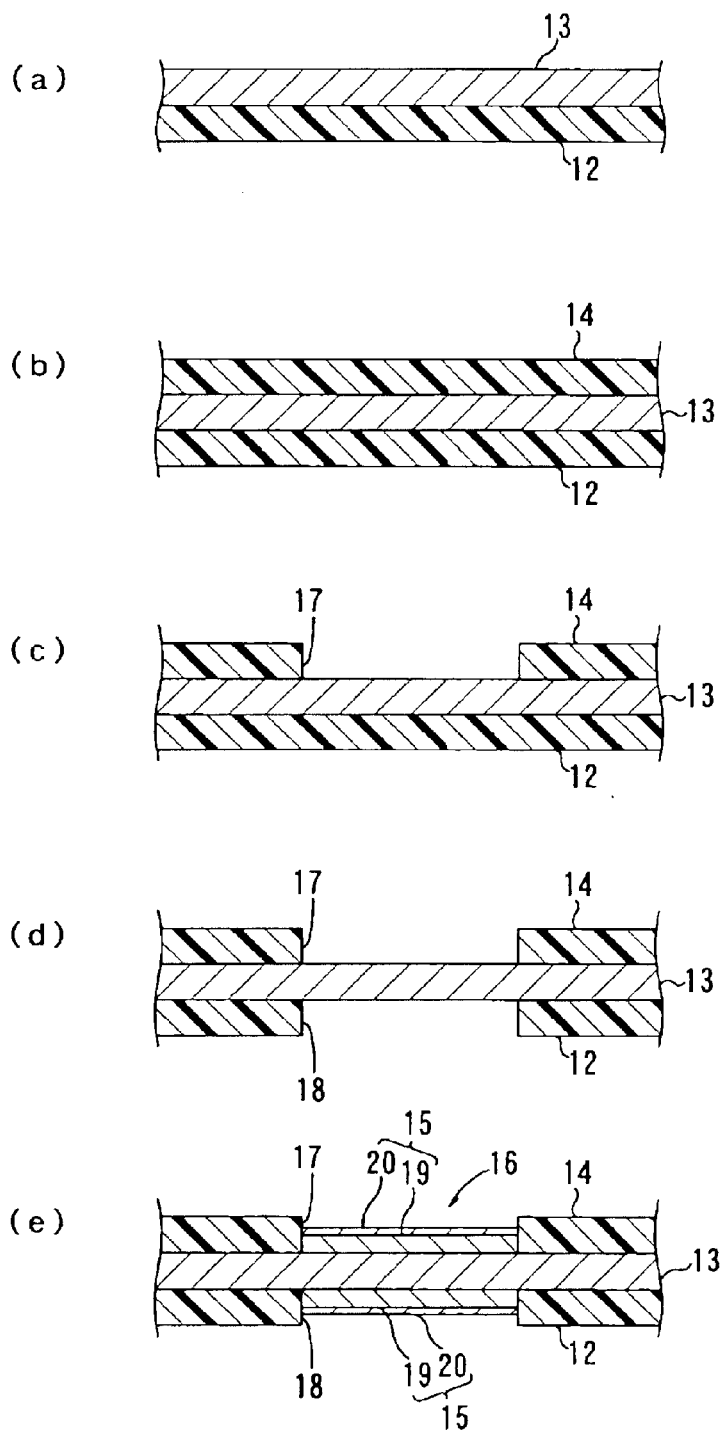
FIG. 3 illustrates the production processes of a wired circuit board shown in FIG. 1.

This wired circuit board 11 is formed in the following way. First, as shown in FIG. 3(a), the conductive pattern 13 is formed on the base layer 12 formed in a film-like form, in the form of the specified wired circuit pattern by a known patterning process, such as a subtracting process, an additive process and a semi-additive process. Then, as shown in FIG. 3(b), the base layer 12 is covered with the cover layer 14 in a known method, for example, by adhesive bonding a film-like resin to the conductive pattern 13 or by applying a photosensitive resin to the conductive pattern 13 and then curing that resin.

In the wired circuit board 11 thus formed, as shown in FIG. 1(a), the cover layer 14 is opened to expose a front side of the conductive pattern 13 and also the base layer 12 is opened to expose a back side of the conductive pattern 13 in such a manner that the exposed front side of the conductive pattern 13 and the exposed back side of the same correspond in position to each other so as to expose the both sides of the conductive pattern 13. Then, on the both sides of the exposed conductive pattern 13, metal plating layers 15 are formed thereby forming the terminal portion 16 in the form of the flying lead.

This terminal portion 16 is formed in the following manner. First, a cover-side opening 17 is formed in the cover layer 14 in a portion thereof in which the terminal portion 16 is to be formed, in a known method, such as drilling, laser machining, etching and patterning of photosensitive resin, as shown in FIG. 3(c). Likewise, a base-side opening 18 is formed in the base layer 12 in a portion thereof corresponding to the cover-side opening 17, in a known method, such as drilling, laser machining, etching and patterning of photosensitive resin, as shown in FIG. 3(d). The cover-side opening 17 and the base-side opening 18 are opened into a rectangular shape to cover all the lines of wire 13a, 13b, 13c and 13d.

As shown in FIG. 3(e), the metal plating layers 15 are formed by plating on both sides of the conductive pattern 13 exposed in the cover-side opening 17 and the base-side opening 18.

No particular limitation is imposed on the plating method used for forming the metal plated layer 15. The metal plating layer 15 may be formed by either of electrolysis plating and electroless plating. Also, no particular limitation is imposed on the metals used for the plating. Known metals may be used for the plating. It is preferable that the electrolysis nickel plating and the electrolysis gold plating are performed in sequence so that a gold plated layer 20 is formed on a nickel plated layer 19. The nickel plated layer 19 and the gold plated layer 20 each have thickness of the order of 1–5 $\mu$m.

The wired circuit board 11 has the terminal portion 16 in the form of the flying lead. In the terminal portion 16, widened portions 22 as reinforcing portions which extend in a widthwise direction substantially orthogonal to an extending direction of the conductive pattern 13 are provided in the conductive pattern 13 in crossing areas 21 where the ends of the cover-side opening 17/base-side opening 18 and the conductive patterns 13 cross each other, as shown in FIG. 1(b).

To be more specific, the widened portions 22 are formed in the respective lines of wire 13a, 13b, 13c and 13d at positions thereof which correspond to the crossing areas 21 (two areas per each line of wire) and arranged with space from each other along the longitudinal direction of the lines of wire 13a, 13b, 13c and 13d. The widened portions 22 are formed in such a generally round shape as to protrude widthwise from the lines of wire 13a, 13b, 13c and 13d.

Figure 2:
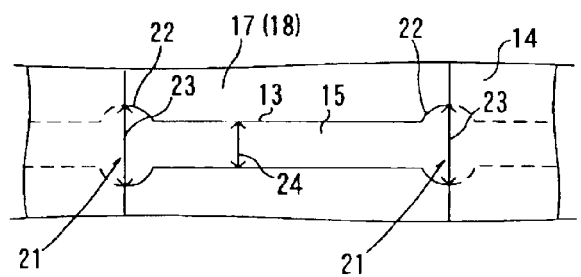
FIG. 2 is an enlarged plan view of FIG. 1(b).

As shown in FIG. 2, each widened portion 22 is arranged, with its generally outer half portion embedded in the cover layer 14/base layer 12 and its generally inner half portion exposed in the cover-side opening 17/base-side opening 18, when a maximum widthwise length 23 between the adjacent lines of wire is defined as a boundary between the outer half portion and the inner half portion. Thus, the terminals 16 are formed in such a dumbbell shape that the lines of wire 13a, 13b, 13c and 13d are protruded widthwise at both ends thereof in the cover-side opening 17/the base-side opening 18.

Each widened portion 22 is so formed that the maximum widthwise length 23 is 1.1–4 times, or preferably 2–3 times, as longer as a usual line width 24 of the lines of wire 13a, 13b, 13c and 13d exposed outside in the cover-side opening 17/base-side opening 18. To be more specific, a widthwise part of widened portion 22 at the maximum widthwise length 23 is 20–1,000 $\mu$m in length and a lengthwise part of the widened portion 22 extending in a longitudinal direction of the lines of wire 13a, 13b, 13c and 13d is 50–500 $\mu$m in length.

The widened portions 22 may be formed in any shape other than the generally round shape, as long as they are shaped to protrude widthwise and have widths larger than the usual width. For example, the widened portion 22 may be formed in rectangle.

The terminal portion 16 having this widened portion 22 can be formed in the processes given below. The widened portions 22 are formed with the patterning of the wired circuit pattern in the process of forming the conductive pattern 13. Then, in the processes of FIGS. 3(c) and (d), the cover layer 14 and the base layer 12 are each opened so that the maximum widthwise length 23 of the widened portion 22 can be within the crossing areas 21 and thereby the cover-side opening 17 and the base-side opening 18 are formed. Thereafter, in the process shown in FIG. 3(e), the metal plated layer 15 is formed on each side of the conductive pattern 13 exposed in the cover-side opening 17 and the base-side opening 18.

In this formation of the wired circuit board 11, since the widened portions 22 widened in the widthwise direction of the conductive pattern 13 are formed in the conductive pattern 13 in the crossing areas 21 where the ends of the cover-side opening 17/the base-side opening 18 and the conductive pattern 13 are crossed each other, the physical strength of the conductive pattern 13 at the ends of the cover-side opening 17 and at the ends of the base-side opening 18 can be reinforced. This can produce the effect that for example when the conductive pattern 13 is subject to stress concentration at exposed portions thereof at ends of the cover-side opening 17 and base-side opening 18 in the process of bonding the terminal portions 16 and the external connecting terminals by applying supersonic vibration of a bonding tool, the disconnection of the conductive pattern 13 can be effectively prevented, thus providing improved connection reliability.

In addition, the wired circuit board 11 may be formed so that the terminal portion 16 presented in the form of this flying lead can have cover-side projections 25 formed as the reinforcing portions and base-side projections 26 formed as the reinforcing portions, as shown in FIG. 4. Specifically, the cover-side projections 25 are formed to project from the ends of the cover-side opening 17 onto the conductive pattern 13 in the cover-side opening 17 in the cover layer 14 in the crossing areas 21 where the ends of the cover-side opening 17/the base-side opening 18 and the conductive patterns 13 are crossed each other. The base-side projections 26 are formed to project from the ends of the base-side opening 18 onto the conductive pattern 13 in the base-side opening 18 in the base layer 12 in the crossing areas 21.

To be more specific, the cover-side projections 25 and the base-side projections 26 are formed in the respective lines of wire 13a, 13b, 13c and 13d at positions thereof which correspond to the crossing areas 21 (two areas per each line of wire) and arranged with space from each other along the longitudinal direction of the lines of wire 13a, 13b, 13c and 13d, as shown in FIG. 4(b). These projections 25, 26 are formed in a convex shape projecting inwardly from the ends of the cover-side opening 17 and the base-side opening 18 along the extending direction of the lines of wire 13a, 13b, 13c and 13d, respectively.

The cover-side projections 25 and the base-side projections 26 are overlapped with the lines of wire 13a, 13b, 13c and 13d and are so tapered (shaped generally in triangle as viewed from the top) that the overlap can gradually reduce toward the inside of the cover-side opening 17/base-side opening 18, respectively. As a result of this, the terminal portions 16 are so formed that the lines of wire 13a, 13b, 13c and 13d can be covered with the cover-side projections 25 and the base-side projections 26 at opposite ends thereof in the cover-side opening 17 and the base-side opening 18.

The cover-side projections 25 and the base-side projections 26 are formed to project at projection length 27 of one-fourth to one-thirtieth, or preferably one-fifth to one-twentieth, to a line length 29 of each of the lines of wire 13a, 13b, 13c and 13d exposed in the cover-side opening 17 and the base-side opening 18, as shown in FIG. 5. To be more specific, each of the cover-side projections 25 and the base-side projections 26 has a basal width 28 of 5–20 μm slightly smaller than a line width 24 of lines of wire 13a, 13b, 13c and 13d at the ends of the cover-side opening 17/the base-side opening 18. The cover-side projections 25 and the base-side projections 26 are projected inwardly in a taped manner at a projection length 27 of 5–250 μm and are formed in a generally triangle whose top is located at a widthwise center of lines of wire 13a, 13b, 13c and 13d.

The shape of the cover-side projections 25 and the base-side projections 26 is not limited to the one shown in FIG. 5, as long as those projections have such a shape as to overlap with the lines of wire 13a, 13b, 13c and 13d along the longitudinal direction of the lines of wire 13a, 13b, 13c and 13d. For example, as shown in FIG. 6, the cover-side projections 25 and the base-side projections 26 may be formed to project toward the inside thereof in a tapered manner from the ends of the cover-side opening 17/the base-side opening 18, with the basal width 28 slightly larger than the line width 24 of the lines of wire 13a, 13b, 13c and 13d. Further, those projections 25, 26 may be formed in such a rectangular shape as to overlap with the lines of wire 13a, 13b, 13c and 13d along the longitudinal direction of the lines of wire 13a, 13b, 13c and 13d, without limiting to the generally triangle shape.

The terminal portions 16 having these cover-side projections 25 and the base-side projections 26 are formed as follows. In the process of FIG. 3(c), the cover layer 14 is opened in such a manner as to form the cover-side projections 25 to thereby produce the cover-side opening 17. In the process of FIG. 3(d), the base layer 12 is opened in such a manner as to form the base-side projections 26 to thereby produce the base-side opening 18. Thereafter, in the process of FIG. 3(e), the metal plated layer 15 is formed on each side of the conductive pattern 13 exposed in the cover-side opening 17 and the base-side opening 18.

In this formation of the wired circuit board 11, since the cover-side projections 25 and the base-side projections 26 are formed in the cover layer 14 and the base layer 12 in the crossing areas 21 where the ends of the cover-side opening 17/the base-side opening 18 and the conductive patterns 13 are crossed each other, so as to project from the ends of the cover-side opening 17/the base-side opening 18 onto the conductive pattern 13 in the cover-side opening 17 and the base-side opening 18, respectively, the physical strength of the conductive pattern 13 at the ends of the cover-side opening 17 and at the ends of the base-side opening 18 can be reinforced. This can produce the effect that for example when the conductive pattern 13 are subject to stress concentration at exposed portions thereof at ends of the cover-side opening 17 and base-side opening 18 in the process of bonding the terminal portions 16 and the external connecting terminals by applying supersonic vibration of the bonding tool, the disconnection of the conductive pattern 13 can be effectively prevented, thus providing improved connection reliability.

It is to be noted that in the wired circuit board 11, both of cover-side projections 25 and the base-side projections 26 are not necessarily required. For example, only the cover-side projections 25 may be formed, as shown in FIG. 7. Alternatively, only the base-side projections 26 may be formed, as shown in FIG. 8.

Further, modification may be made of the invention by forming the widened portions 22 in the conductive pattern 13 and also forming the cover-side projections 25 in the cover layer 14 and/or forming the base-side projections 26 in the base layer 12, though not shown.

The wired circuit board 11 having these terminal portions 16 is particularly preferably applicable to a suspension board with circuit.

Referring to FIG. 9, there is shown a perspective view of a suspension board with circuit presented as an embodiment of the wired circuit board of the present invention. The suspension board with circuit 31 mounts thereon a magnetic head of a hard disk driver (not shown) and suspends the magnetic head while holding a minute interval between the magnetic head and a magnetic disk against airflow generated when the magnetic head and the magnetic disk run relative to each other. The suspension board with circuit has the lines of wire 34a, 34b, 34c, 34d, integrally formed in the form of a specified wired circuit pattern, for connecting the magnetic head and a read/write board 39 formed as an external circuit.

In FIG. 9, the suspension board with circuit 31 has a base layer 33, as a first insulating layer of insulating material, which is formed on a supporting board 32 extending longitudinally as a metal supporting layer. A conductive pattern 34 is formed on the base layer 33 in the form of a specified wired circuit pattern, and a cover layer 35 (see FIG. 10) is formed on the conductive pattern 34 as a second insulating layer of insulating material. The conductive pattern 34 is provided in the form of the plurality of lines of wire 34a, 34b, 34c and 34d arrayed in parallel with spaced at a predetermined interval.

Gimbals 36 for fitting the magnetic head therein are formed in the supporting board 32 by cutting out the supporting board 32 at a front end portion thereof At the front end portion of the supporting board 32, magnetic head connecting terminals 37 are formed to connect between the magnetic head and the lines of wire 34a, 34b, 34c and 34d. At the rear end portion of the supporting board 32, external-side connecting terminals 38 as the terminals are formed to connect between the read/write board 39 and the lines of wire 34a, 34b, 34c and 34d. The external-side connecting terminals 38 are formed in the ends of the lines of wire 34a, 34b, 34c and 34d, to correspond to each of the read/write terminals 54.

This suspension board with circuit 31 can be formed in the following processes. First, the supporting board 32 is prepared and the base layer 33 is formed on the supporting board 32 in the form of the specified pattern, as shown in FIGS. 10(a)–(d). A metal foil or a metal sheet is preferably used as the supporting board 32. For example, stainless steel, 42 alloy and the like are preferably used. The supporting board 32 used preferably has thickness of 10–60 μm, or further preferably 15–30 μm, and width of 50–500 mm, or further preferably 125–300 mm.

Insulating material used for forming the base layer 33 is not limited to any particular insulating material. The insulating materials that may be used include, for example, synthetic resins such as polyimide resin, acrylic resin, polyether nitrile resin, polyether sulfonic resin, polyethylene terephthalate resin, polyethylene naphthalate resin and polyvinyl chloride resin. Of these synthetic resins, a photosensitive resin is preferably used as the base layer. A photosensitive polyimide resin is further preferably used.

Then, for example when the base layer 33 is formed in the specified pattern on the supporting board 32 by using photosensitive polyimide resin, liquid solution of precursor of the photosensitive polyimide resin is applied to the whole area of the supporting board 32 prepared first, and then is dried, for example, at 60–150° C., to form a coating 33p of the precursor of the photosensitive polyimide resin, as shown in FIG. 10(a).

Then, the coating 33p is exposed to light through a photomask 40, as shown in FIG. 10(b). If required, the exposed part is heated to a specified temperature. Thereafter, the coating 33p is developed to form the coating 33p into a specified pattern, as shown in FIG. 10(c). Preferably, radiation irradiated for the exposure has an exposure wavelength in the range of 300–450 nm, or preferably 350–420 nm. An integrated quantity of exposure light is preferably in the range of 100–1,000 mJ/cm$^2$, or further preferably 200–700 mJ/cm$^2$. Further, when the exposed part of the coating 33p irradiated is heated, for example, at a temperature in the range of not less than 130° C. to less than 150° C., it is solubilized (positive type) for the next processing procedure (development), while on the other hand, when heated, for example, at a temperature in the range of not less than 150° C. to not more than 180° C., it is non-solubilized (negative type) for the next processing procedure (development). The development can be performed by any known method, such as a dipping process and a spraying process, by using a known developing solution such as alkaline developer. Preferably, the manufacturing method uses the negative type to produce the circuit pattern. Illustrated in FIG. 10 is an embodiment using the process steps of negative type for patterning the circuit.

As shown in FIG. 10(d), the coating 33p of the precursor of the polyimide resin thus patterned is finally heated, for example, to 250° C. or more to be cured (imidized), whereby the base layer 33 of polyimide resin is formed in the specified pattern. The base layer 33 thus formed have a thickness in the range of e.g. 2–30 μm, or preferably 5–20 μm.

Sequentially, the conductive pattern 34 is formed on the base layer 33 in the form of a specified wired circuit pattern, as shown in FIG. 10(e). The conductive materials that may be used for forming the conductive pattern 34 include metals, such as copper, nickel, gold, solder or alloys thereof. Copper is preferably used. To form the conductive pattern 34 in the specified wired circuit pattern, the conductive pattern 34 may be formed on the base layer 33 in the specified wired circuit pattern in any known patterning process, such as the subtracting process, the additive process and the semi-additive process. In this method, the semi-additive process is preferably used.

The conductive pattern 34 thus formed is in the form of a pattern formed by the plurality of lines of wire 34a, 34b, 34c and 34d which are spaced from each other in parallel with a given interval, as mentioned above. The conductive pattern 34 has a thickness in the range of e.g. 2–30 μm, or preferably 5–20 μm. The lines of wire 34a, 34b, 34c and 34d have a line width in the range of e.g. 10–500 μm, or preferably 30–200 μm. The interval (space width) between the adjacent lines of wire 34a, 34b, 34c and 34d is in the range of e.g. 10–500 μm, or preferably 30–200 μm.

Sequentially, the conductive pattern 34 is covered with the cover layer 35 of insulating material, as shown in FIGS. 10(f)–(i). The same insulating material as the insulating material of the base layer 33 is used for forming the cover layer 35. Preferably, photosensitive polyimide resin is used therefor.

For example when the cover layer 35 is formed by using the photosensitive polyimide resin, liquid solution of precursor of the photosensitive polyimide resin is applied to the whole area of the supporting board 32 and the base layer 33, first, and then is dried at a temperature in the range of e.g. 60–150° C., in the same manner as in the patterning of the base layer 33, to form a coating 35p of the precursor of the photosensitive polyimide resin, as shown in FIG. 10(f). Then, the coating 35p is exposed to light through the photomask 41, as shown in FIG. 10(g). If required, the exposed part is heated to a certain temperature. Thereafter, the coating 35p is developed to be patterned so that the conductive pattern 34 can be covered with the coating 35p, as shown in FIG. 10(h).

In the patterning of the coating 35p, the photomasks 41 are placed to confront the areas where the external-side connecting terminals 38 are formed, so that the front side of the conductive pattern 34 can be exposed from the coating 35p to form the cover-side opening 42. To be more specific, the coating 35p is opened so that the cover-side opening 42 can be formed in such a rectangle shape as to include the lines of wire 34a, 34b, 34c and 34d, so as to provide the external-side connecting terminals 38 in the form of the flying lead, as mentioned later.

The coating 35p can be exposed to light and developed under the same condition as the condition for exposing and developing the base layer 33. Shown in FIG. 10 is the patterning in which the coating 35p is patterned in the negative type in the same manner as in the case of the base layer 33.

As shown in FIG. 10(i), the coating 35p of the precursor of the polyimide resin thus patterned is finally heated, for example, to 250° C. or more to be cured (imidized), whereby the cover layer 35 made of polyimide resin is formed on the conductive pattern 34. The cover layer 35 has a thickness in the range of e.g. 1–30 μm, or preferably 2–5 μm.

Before the cover layer 35 is formed on the conductive pattern 34, the conductive pattern 34 may be protected by a thin film of rigid nickel by nickel plating.

In the suspension board with circuit 31 thus formed, the external-side connecting terminals 38 are presented in the form of the flying lead exposed at both sides of the conductive pattern 34, as shown in FIGS. 10(j)–(l).

The external-side connecting terminals 38 are presented in the form of the terminals exposed at both sides of the conductive pattern 34 in the following processes. First, as shown in FIG. 10(j), supporting-board-side openings 43 are formed in the supporting board 32 at portions thereof where the external-side connecting terminals 38 are formed or at portions thereof corresponding to the cover-side openings 42 of the cover layer 35, so that the base layer 33 can be exposed. The supporting-board-side openings 43 can be formed by any known method. For example, after all area of the supporting board 32 but the areas of the same corresponding to the supporting-board-side openings 43 are subjected to masking, they are chemically etched.

Sequentially, as shown in FIG. 10(k), base-side openings 44 are formed in the base layer 33 exposed in the supporting-board-side openings 43 of the supporting board 32, so as to expose the conductive pattern 34. Though the base-side openings 44 can be formed by a known method, the base-side openings 44 are preferably formed by etching or by plasma etching, in particular. The etching enables a portion of the base layer 33 to be precisely cut from the exposed surface of the base layer 33 to the back side of the conductive pattern 34.

In the plasma etching, the supporting board 32 can be used as the mask to etch the entire base layer 33 exposed in the supporting-board-side openings 43 of the supporting board 32. For example, after the sample is disposed between opposed electrodes in an atmosphere in which a prescribed gas is filled in therebetween, high-frequency plasma is produced therebetween. The prescribed gases that may be used include, for example, He, Ne, Ar, Xe, Kr, $N_2$, $O_2$, $CF_4$ and $NF_3$. Of these gases, Ar, $O_2$, $CF_4$ and $NF_3$ are preferably used. These gases may be used in mixture in a prescribed proportion. The gas pressure (degree of vacuum) is in the range of 0.5–200 Pa, or preferably 10–100 Pa. Cited as the conditions required for producing the high-frequency plasma are the frequency in the range of e.g. 10 kHz–20 MKz, or preferably 10 kHz–100 kHz, and the power required for the plasma etching in the range of e.g. 0.5–10 $W/cm^2$, or preferably 1–5 $W/cm^2$. The frequency in the range of 10 kHz–100 kHz can make it easy to match with a plasma etching device (tune for resistances). In these atmospheric conditions, the sample is disposed on the electrodes whose temperature is controlled to e.g. 0–120° C., or preferably 10–80° C., and is etched for the time required for the base layer 33 to be etched to a predetermined thickness.

Since the base-side openings 44 of the base layer 33 thus formed are formed by using the supporting board 32 as the mask, they can be formed in the same size and shape as the supporting-board-side openings 43 of the supporting board 32.

Thereafter, as shown in FIG. 10(l), metal plated layers 45 are simultaneously formed by plating on both sides of the conductive pattern 34 thus exposed. The metal plated layers 45 can be formed by using either the electrolysis plating or the electroless plating, without any particular limitation. Also, the plating can be formed by using any known metal, without any particular limitation. Preferably, the electrolysis nickel plating and the electrolysis gold plating are sequentially performed to form a gold plated layer 47 on a nickel plated layer 46. Preferably, the nickel plated layer 46 and the gold plated layer 47 both have a thickness in the range of about 1–5 μm. As a result of this, the external-side connecting terminals 38 are formed with the conductive pattern exposed at both sides thereof.

As shown in FIG. 11, in the external-side connecting terminals 38 of the suspension board with circuit 31, widened portions 49 as reinforcing portions extending in a widthwise direction substantially orthogonal to an extending direction of the conductive pattern 34 are provided in the conductive pattern 34 in the crossing areas 48 where the ends of the cover-side opening 42/the base-side opening 44 and the conductive patterns 34 cross each other, as is the case with the wired circuit board 11.

To be more specific, the widened portions 49 are formed in the respective lines of wire 34a, 34b, 34c and 34d at positions thereof which correspond to the crossing areas 48 (two areas per each line of wire) and arranged with space from each other along the longitudinal directions of the lines of wire 34a, 34b, 34c and 34d. The widened portions 49 are formed in such a generally round shape as to protrude widthwise from the lines of wire 34a, 34b, 34c and 34d, as shown in FIG. 11(b). Each widened portion 49 is arranged, with its generally outer half portion embedded in the cover layer 35/base layer 33 and its generally inner half portion exposed in the cover-side opening 42, the base-side opening 44 and the supporting-board-side opening 43, when a maximum widthwise length between the adjacent lines of wire is defined as a boundary between the outer half portion and the inner half portion, as is the case with widened portions 22 of the wired circuit board 11. Thus, the external-side connecting terminals 38 are formed in such a dumbbell shape that the lines of wire 34a, 34b, 34c and 34d are protruded widthwise at both ends thereof in the cover-side opening 42, the base-side opening 44 and the supporting-board-side opening 43.

The widened portions 49 may be made identical in the maximum widthwise length and the longitudinal length extending along the extending direction of the conductive pattern 34 with the widened portions 22 of the wired circuit board 11 mentioned above. Also, the widened portions 49 may be formed in any shape other than the generally round shape, as long as they are shaped to protrude widthwise and have widths larger than the usual width. For example, the widened portion 49 may be formed in rectangle.

The external-side connecting terminals 38 having these widened portions 49 can be formed in the processes given below. The widened portions 49 are formed with the patterning of the wired circuit pattern in the process of forming the conductive pattern 34. Then, in the processes of FIGS. 10(h) and (k), the cover layer 35, the supporting board 32 and the base layer 33 are each opened so that the maximum widthwise length of the widened portion 49 can be within the crossing areas 48 and thereby the cover-side opening 42, the supporting-board-side opening 43 and the base-side opening 44 are formed. Thereafter, in the process shown in FIG. 10(i), the metal plated layer 45 is formed on each side of the conductive pattern 34 exposed in the cover-side opening 42 and the base-side opening 44/supporting-board-side opening 43.

In this formation of the suspension board with circuit 31, since the widened portions 49 widened in the widthwise direction of the conductive pattern 34 are formed in the conductive pattern 34 in the crossing areas 48 where the ends of the cover-side opening 42/base-side opening 44 and the conductive pattern 34 are crossed each other, the physical strength of the conductive pattern 34 at the ends of the cover-side opening 42 and at the ends of the base-side opening 44 can be reinforced. This can produce the effect that for example when the conductive pattern 34 are subject to stress concentration at exposed portions thereof at ends of the cover-side opening 42 and base-side opening 44 in the process of bonding the external-side connecting terminals 38 and the read/write terminals 54 by applying supersonic vibration of the bonding tool, the disconnection of the conductive pattern 34 can be effectively prevented, thus providing further improved connection reliability.

In addition, the suspension board with circuit 31 may be formed so that the external-side connecting terminals 38 presented in the form of this flying lead can have cover-side projections 50 formed as the reinforcing portions and base-side projections 51 formed as the reinforcing portions, as shown in FIG. 12. Specifically, the cover-side projections 50 are formed to project from the ends of the cover-side opening 42 onto the conductive pattern 34 in the cover-side opening 42 in the cover layer 35 in the crossing areas 48 where the ends of the cover-side opening 42/the base-side opening 44 and the conductive patterns 34 are crossed each other. The base-side projections 51 are formed to project from the ends of the base-side opening 44 onto the conductive pattern 34 in the base-side opening 44 in the base layer 33 in the crossing areas 48.

To be more specific, the cover-side projections 50 and the base-side projections 51 are formed in the lines of wire 34a, 34b, 34c and 34d at positions thereof corresponding to the crossing areas 48, two for each, with spaced from each other along the longitudinal direction of the lines of wire 34a, 34b, 34c and 34d, as shown in FIG. 12(b). These projections are formed in a convex shape projecting inwardly from the ends of the cover-side opening 42 and the base-side opening 44 along the extending direction of the lines of wire 34a, 34b, 34c and 34d, respectively. The cover-side projections 50 and the base-side projections 51 are overlapped with the lines of wire 34a, 34b, 34c and 34d and are so tapered (shaped generally in triangle as viewed from the top) that the overlap can gradually reduce toward the inside of the cover-side opening 42/base-side opening 44, respectively. As a result of this, the external-side connecting terminals 38 are so formed that the lines of wire 34a, 34b, 34c and 34d can be covered with the cover-side projections 50 and the base-side projections 51 at opposite ends thereof in the cover-side opening 42 and the base-side opening 44.

The cover-side projections 50 and the base-side projections 51 may be made identical in projection length and basal width with the cover-side projections 25 and the base-side projections 26 of the wired circuit board 11. Also, the shape of the cover-side projections 50 and the base-side projections 51 is not limited to the one shown in FIG. 12(b), as long as those projections have such a shape as to overlap with the lines of wire 34a, 34b, 34c and 34d along the longitudinal direction of the lines of wire 34a, 34b, 34c and 34d. For example, the cover-side projections 50 and the base-side projections 51 may be formed to project toward the inside thereof in a tapered manner, with the basal width slightly larger than the line width of the lines of wire 34a, 34b, 34c and 34d. Further, those projections 50, 51 may be formed in such a rectangular shape as to overlap with the lines of wire 34a, 34b, 34c and 34d along the longitudinal direction of the lines of wire 34a, 34b, 34c and 34d, without limiting to the generally triangle shape.

The external-side connecting terminals 38 having these cover-side projections 50 and the base-side projections 51 can be formed as follows. In the processes FIGS. 10(g)–(i), the cover layer 35 is opened in such a manner as to form the cover-side projections 50 to thereby produce the cover-side opening 42. In the process of FIG. 10(k), the base layer 33 is opened in such a manner as to form the base-side projections 50 to thereby produce the base-side opening 44. Thereafter, in the process of FIG. 10(l), the metal plated layer 45 is formed on each side of the conductive pattern 34 exposed in the cover-side opening 42 and the base-side opening 44.

In this formation of the suspension board with circuit 31, since the cover-side projections 50 and the base-side projections 51 are formed at the cover layer 35 and the base layer 33 in the crossing areas 48 where the ends of the cover-side opening 42/base-side opening 44 and the conductive patterns 43 cross each other, so as to project from the ends of the cover-side opening 42/the base-side opening 44 onto the conductive pattern 34 in the cover-side opening 42 and the base-side opening 44, respectively, the physical strength of the conductive pattern 34 at the ends of the cover-side opening 42 and at the ends of the base-side opening 44 can be reinforced. This can produce the effect that for example when the conductive pattern 34 is subject to stress concentration at exposed portions thereof at ends of the cover-side opening 42 and base-side opening 44 in the process of bonding he external-side connecting terminals 38 and the read/write terminals 54 by applying supersonic vibration of the bonding tool, the disconnection of the conductive pattern 34 can be effectively prevented, thus providing improved connection reliability.

It is to be noted that in the suspension board with circuit 31, both of cover-side projections 50 and the base-side projections 51 are not necessarily required. For example, only the cover-side projections 50 may be formed, as shown in FIG. 13. Alternatively, only the base-side projections 51 may be formed, as shown in FIG. 14.

Further, modification may be made of the invention by forming the widened portions 49 in the conductive pattern 34 and also forming the cover-side projections 50 in the cover layer 35 and/or forming the base-side projections 51 in the base layer 33, though not shown.

In this suspension board with circuit 31, the external-side connecting terminals 8 may be formed in such a manner that the conductive pattern 34 is depressed toward the supporting boar 32 with respect to the remaining portions of the conductive pattern 34 at its portions corresponding to the external-side connecting terminals 38 and also the base-side opening 44 and the supporting-board-side opening 43 are made larger than the areas in which the metal plated layers 45 are formed, as shown in FIG. 15(a). In the external-side connecting terminals 38 thus formed, the widened portion 49 may be formed in the conductive pattern 34 in the crossing areas 48 where the ends of the cover-side opening 42/base-side opening 44 and the conductive pattern 34 cross each other, as shown in FIG. 12(b).

This suspension board with circuit 31 can be formed in the processes shown in FIG. 16, for example. First, the coating 33p of the liquid solution of precursor of the photosensitive polyimide resin is formed on the previously prepared supporting board 32 in the same manner as in the above, as shown in FIG. 16(a). Then, as shown in FIG. 16(b), in the process of exposing the coating 33p to light, in addition to the photomasks 40 that permit no irradiated light to transmit through the masks, photomasks 52 that permit the irradiated light to partially transmit through the masks (average transmittance ratio in the range of 1–99%) are placed to confront the areas for the external-side connecting terminals 38 to be formed in the coating 33p. Then, the coating 33p is exposed to light through the photomask 52, such that the area in the coating 33p in which the external-side connecting terminals 38 is to be formed is exposed to a smaller amount of light exposure than an amount of light exposure to the remaining areas of the coating 33p. Sequentially, the coating is developed and cured, as mentioned above. As a result of this, the areas of the base layer 33 in which the external-side connecting terminals 38 is to be formed is made smaller in thickness than the remaining areas of the base layer 33, as shown in FIGS. 16(c) and (d).

The photomasks 52 may be formed in the following manner. For example, a semi-translucent part of the front surface of the photomask 52 is finely roughened so that components of irregular reflection on the front surface of the photomask 52 can be increased to reduce components of the transmitted light in that part. Or, an irradiated light absorbing film is stuck on the semi-translucent part of the photomask 52 so that the components of the transmitted light in that semi-translucent part can be reduced. Or, a pattern having a light transmitting area and a light shielding area is formed on the semi-translucent part of the photomask 52 so that the components of the transmitted light in that part can be reduced.

Further, in the case of the photomask 52 comprising a thin metal film forming a light-shielding pattern thereon, a thin metal film smaller in thickness than the thin metal film of the photomask 52 may be formed on the semi-translucent part of the photomask 52 so that the components of the transmitted light in that semi-translucent part can be reduced. In other words, this photomask 52 can be formed in the following manner: A photomask 52 with no thin metal film formed in the semi-translucent part thereof (a conventional photomask) is formed. After a resist is formed on that photomask 52 so that only the semi-translucent part can be exposed, a thin metal film made of e.g. chromium smaller in thickness than the above-mentioned thin metal film is formed on the photomask 52 by vapor deposition or by plating and, thereafter, the resist is peeled.

Of these photomasks 52, the photomasks 52 each having the semi-translucent part 53 on which the pattern of the light transmiting area and the light shielding area is formed as shown in FIG. 17 are preferably used. These photomasks 52 are each made of a sheet of glass, such as quartz glass or soda glass, of thickness of 2–5 mm. The thin metal film formed on the semi-translucent part 53 of the photomask 52 made of the glass is patterned so that the light transmission ratio (transmissivity) in the semi-translucent part 53 of the glass can be reduced more than in the remaining parts of the glass. The pattern of the thin metal film can be formed, for example, by the process that after a thin metal film made of e.g. chromium is formed on the whole area of the glass by vapor deposition or by plating, the thin metal film is patterned by use of laser or electron beam. To be more specific, the pattern of the semi-translucent part 53 is preferably presented in the form of a repeat pattern in which the light transmitting portions and the light shielding portions being alternately arranged at a not more than 6 μm pitch (width of the light transmitting portion and the light shielding portion) and of which averaged transmittance ratio is not more than 80% or preferably not more than 50%. For example, a striped pattern having the average transmission ratio of about 50% as shown in FIG. 17(a); a latticed pattern having the average transmission ratio of about 25% as shown in FIG. 17(b); a circular staggered pattern having the average transmission ratio of about 25% as shown in FIG. 17(c); and a circular staggered pattern having the average transmission ratio of about 70% as shown in FIG. 17(d) are preferably used.

While the patterning is provided in the negative type in the embodiment mentioned above, the patterning can be provided in the positive type as well. For example when the patterning is provided in the positive type, the photomask 52 may be so structured that the transmission ratio of irradiated light in the semi-translucent part of the photomask can be increased more than in the remaining parts of the photomask.

The base layer 33 thus formed has a thickness in the range of e.g. 2–30 μm, or preferably in the range of 5–20 μm. The base layer 33 usually has a thickness of about 10 μm. The area of the base layer 33 in which the external-side connecting terminals 38 are to be formed has a thickness of usually 80% or less of the thickness of the remaining areas. For example, that area of the base layer 33 preferably has thickness of not more than 8 μm, or further preferably not more than 5 μm. Suppose that the area of the base layer 33 in which the external-side connecting terminals 38 are to be formed has thickness of 8 μm or less, when the remaining areas have a usual thickness of 10 μm, the time required for the opening to be formed in the later stage can be shortened to the extent corresponding to 2 μm.

The area of the base layer 33 in which the external-side connecting terminals 38 are to be formed has a lower limit of thickness or a minimum thickness to serve as a barrier layer against the conductive pattern 34 when the supporting board 32 is opened. For example, the area of the base layer 33 in which the external-side connecting terminals 38 are to be formed can have e.g. 3 μm, or further about 1 μm, as the minimum thickness. Accordingly, the area of the base layer 33 in which the external-side connecting terminals 38 are to be formed preferably has a thickness in the range of 0.1–8 μm or further preferably 1.0–5 μm.

Sequentially, the conductive pattern 34 is formed on the base layer 33 in the form of a specified wired circuit pattern in the same manner as in the above, as shown in FIG. 16(e). Since the areas of the base layer 33 on which the external-side connecting terminals 38 are to be formed are made smaller in thickness than the remaining areas of the base layer 33, the conductive pattern 34 is formed so that its portions on which metal plated layers 45 are formed in the later stage are depressed toward the supporting board 32 with respect to the remaining portions of the conductive pattern 34 to an extent corresponding to the reduced thickness. In this formation of the conductive pattern 34, the widened portions 49 are formed simultaneously with the patterning of the wired circuit pattern.

Sequentially, as shown in FIGS. 16(f)–(i), the conductive pattern 34 is covered with the cover layer 35 in the same manner as in the above. Then, the cover-side opening 42 is formed in the area of the conductive pattern 34 in which the external-side connecting terminal 38 is to be formed so that the maximum lengths of the widened portions 49 are placed in the crossing areas 48. Thereafter, the supporting-board-side opening 43 is formed to be larger than the area of the supporting board 32 corresponding to the cover-side opening 42, as shown in FIG. 16(j). Then, the base-side opening 44 is formed in the base layer 33 exposed in the supporting-board-side opening 43 so that the maximum lengths of the widened portions 49 are placed in the crossing areas 48, as shown in FIG. 16(k). Thereafter, the metal plated layers 45 is formed on each side of the conductive pattern 34 exposed in the cover-side opening 42 and in the base-side opening 44/supporting-board-side opening 43, as shown in FIG. 16(l). The metal plated layer 45 thus formed is positioned with a certain space between its periphery and the peripheries of the base-side opening 44 and supporting-board-side opening 43.

When the suspension board with circuit 31 is produced in this method, the base layer 33 is formed to have smaller thickness at the base-side opening 44 for exposing the conductive pattern 34 than at the remaining portions of the base layer 33 in the process of forming the base layer 33. Consequently, when the base layer 33 is etched in the process of forming the external-side connecting terminals 38, as shown in FIG. 16(k), the etching time required for the conductive pattern 34 to be exposed can be shortened to an extent corresponding to the difference between the reduced thickness of the base layer 33 at the opening portions 31 and the thickness of the remaining portions. This enables the conductive pattern 34 to be exposed in a short time, and as such can provide improved efficiency in producing the external-side connecting terminals 38 in the form of the flying lead exposed at both sides thereof.

In this formation, since the base-side opening 44 and the supporting-board-side opening 43 are formed to be larger than the exposed portion of the conductive pattern 34, a certain space is left between the periphery of the metal plated layer 45 and the peripheries of the base-side opening 44 and supporting-board-side opening 43. This can produce the effect that for example when the metal plated layer 45 is increased in thickness for improvement in connection reliability, the metal plated layer 45 and the supporting board 32 can be prevented from contacting with each other. This can surely prevent occurrence of a short circuit from the contact between the metal plated layer 45 and the supporting board 32, thus providing improved connection reliability and voltage proof property of the suspension board with circuit 32.

In the suspension board with circuit 31, the interval formed between the periphery of the metal plated layer 45 and the periphery of the supporting-board-side opening 43 is preferably at least 1 μm, or preferably in the order of 2–100 μm.

Further, in this formation, since the area of the conductive pattern 34 in which the metal plated layer 45 is formed is so formed as to be depressed toward the supporting board 32, the distance from the front side of the supporting board 32 to the front side of the metal plated layer 45 is shortened to an extent corresponding to the depression with respect to the remaining areas of the conductive pattern 34 and, as a result of this, the metal plated layers 45 are placed closer to the outside of the supporting board 32 to that extent. This can produce the effect that for example when the external-side connecting terminals 38 are connected with read/write terminals 54 of the read/write board 39 in such a manner that the read/write terminals 54 are laid over the metal plated layers 45 and are bonded to each other by applying supersonic vibration of the bonding tool, the pressure bonding can be well ensured, thus providing further improved connection reliability.

In the suspension board with circuit 31 thus formed, the thicknesswise interval formed between the front side of the metal plated layers 45 and the interface between the base layer 33 and the supporting board 32 is preferably ±6 μm, or further preferably ±2 μm.

This suspension board with circuit 31 may be formed so that the external-side connecting terminals 38 presented in the form of the flying lead can have cover-side projections 50 formed as the reinforcing portions and base-side projections 51 formed as the reinforcing portions, as shown in FIG. 18. Specifically, the cover-side projections 50 are formed to project from the ends of the cover-side opening 42 onto the conductive pattern 34 in the cover-side opening 42 in the cover layer 35 in the crossing area 48 where the ends of the cover-side opening 42/the base-side opening 44 and the conductive patterns 34 cross each other. The base-side projections 51 are formed to project from the ends of the base-side opening 44 onto the conductive pattern 34 in the base-side opening 44 in the base layer 33 in the crossing areas 48.

To be more specific, the cover-side projections 50 and the base-side projections 51 are formed in the respective lines of wire 34a, 34b, 34c and 34d at positions thereof corresponding to the crossing areas 48 (two areas per each line of wire) and arranged with space from each other along the longitudinal direction of the lines of wire 34a, 34b, 34c and 34d, as shown in FIG. 18(b). These projections are formed in a convex shape projecting inwardly from the ends of the cover-side opening 42 and the base-side opening 44 along the extending direction of the lines of wire 34a, 34b, 34c and 34d, respectively. The cover-side projections 50 and the base-side projections 51 are overlapped with the lines of wire 34a, 34b, 34c and 34d and are so tapered (shaped generally in triangle as viewed from the top) that the overlap can gradually reduce toward the inside of the cover-side opening 42/base-side opening 44, respectively. As a result of this, the external-side connecting terminals 38 are so formed that the lines of wire 34a, 34b, 34c and 34d can be covered with the cover-side projections 50 and the base-side projections 51 at opposite ends thereof in the cover-side opening 42 and the base-side opening 44.

The cover-side projections 50 and the base-side projections 51 may be made identical in projection length and basal width with the cover-side projections 25 and the base-side projections 26 of the wired circuit board 11 mentioned above. Also, the shape of the cover-side projections 50 and the base-side projections 51 is not limited to the one shown in FIG. 18(b), as long as those projections have such a shape as to overlap with the lines of wire 34a, 34b, 34c and 34d along the longitudinal direction of the lines of wire 34a, 34b, 34c and 34d. For example, the cover-side projections 50 and the base-side projections 51 may be formed to project toward the inside thereof in a tapered manner, with the basal width slightly larger than the line width of the lines of wire 34a, 34b, 34c and 34d. Further, those projections 50, 51 may be formed in such a rectangular shape as to overlap with the lines of wire 34a, 34b, 34c and 34d along the longitudinal direction of the lines of wire 34a, 34b, 34c and 34d, without limiting to the generally triangle shape.

In the suspension board with circuit 31 shown in FIG. 18, the base-side opening 44 is formed to be larger in area than the cover-side opening 42, so that the base-side projection 51 is formed to be larger in length than the cover-side projection 50 to that extent corresponding to the difference in area between the base-side opening 44 and the cover-side opening 42, as shown in FIG. 18(a).

The external-side connecting terminals 38 having these cover-side projections 50 and the base-side projections 51 are formed as follows. In the process of FIGS. 16(g)–(i), the cover layer 35 is opened in such a manner as to form the cover-side projections 50 to thereby produce the cover-side opening 42. In the process of FIG. 16(k), the base layer 33 is opened in such a manner as to form the base-side projections 50 to thereby produce the base-side opening 44. Thereafter, in the process of FIG. 16(l), the metal plated layer 45 is formed on each side of the conductive pattern 34 exposed in the cover-side opening 42 and the base-side opening 44.

It is to be noted that in the suspension board with circuit 31 as well, both of cover-side projections 50 and the base-side projections 51 are not necessarily required, as is the case with the above. For example, only the cover-side projections 50 may be formed, as shown in FIG. 19. Alternatively, only the base-side projections 51 may be formed, as shown in FIG. 20.

Further, modification may be made of the invention by forming the widened portions 49 in the conductive pattern 34 and also forming the cover-side projections 50 in the cover layer 35 and/or forming the base-side projections 51 in the base layer 33, though not shown.

Although the external-side connecting terminals 38 provided in the form of the flying lead have been exclusively discussed above, this suspension board with circuit 31 includes magnetic-head-side connecting terminals 37 provided in the form of the flying lead identical with the external-side connecting terminals 38.

EXAMPLES

While in the following, the present invention will be described in further detail with reference to Examples, the present invention is not limited to any Examples.

Example 1

A liquid solution of precursor of photosensitive polyimide resin was applied on the stainless steel foil (SUS304H-TA) having thickness of 20 μm so that after dried, it could have a thickness of 24 μm and then dried at 130° C. to thereby form a coating of the precursor of the photosensitive polyimide resin (Cf. FIG. 16(a)). Sequentially, the coating was exposed to light (405 nm, 1,500 mJ/cm$^2$) through a photomask (Cf. FIG. 16(b)). The exposed part of the coating was heated to 180° C. and then developed by using an alkaline developer, whereby the coating was patterned with the negative imaging (Cf. FIG. 16(c)). Sequentially, the patterned coating of the precursor of the photosensitive polyimide resin was heated at 350° C. to be cured (imidized), whereby a base layer made of polyimide resin of thickness of 10 μm was formed in the specified pattern (Cf. FIG. 16(d)).

In forming the base layer, the photomask of metal film having a latticed repeat pattern in which the light transmitting portions and the light shielding portions are alternately arranged at a not more than 6 μm pitch (which corresponds to the photomask 52 having the average transmission ratio of about 25% shown in FIG. 17(b)), was positioned over the coating at its portion which is to be opened in the later stage and at which an external-side connecting terminals are to be formed. Then, the coating was exposed to light through the photomask, so that the amount of light exposure in the portion of the coating at which the external-side connecting terminals are to be formed could be reduced more than the amount of light exposure in the remaining portions of the coating (Cf. FIG. 16(b)). As a result of this, after the coating was developed and cured, the base layer having a thickness of 2 μm at portions thereof at which the external-side connecting terminals are to be formed and a thickness of 10 μm at the remaining portions thereof was obtained (Cf. FIG. 16(d)).

Sequentially, a thin chrome film of thickness of 300 Å and a thin copper film having thickness of 700 Å were formed in sequence on the whole area of the stainless steel foil and the base layer by a sputtering deposition process. Thereafter, a plating resist having an opposite pattern to the specified wired circuit pattern was formed by use of a dry film resist, and a conductive pattern having the specified wired circuit pattern was formed in the part of the base layer where the plating resist was not formed, in the semi-additive method using the electrolysis copper plating (Cf. FIG. 16(e)). As a result of the base layer being formed to be smaller in thickness at its part at which the external-side connecting terminals are to be formed than at its remaining parts, the conductive pattern thus formed had, at its part at which the external-side connecting terminals are to be formed, concave portions depressed toward the stainless steel foil from the remaining portions of the conductive pattern with respect to the thickness direction by about 8 μm. The conductive pattern was formed to have thickness of 10 μm and have the wired pattern formed by four lines of wire each having width of 110 μm and spaced from each other in parallel at interval of 200 μm.

Further, generally round widened portions (Cf. FIG. 15(b)), which were widened in the widthwise direction substantially orthogonal to the extending direction of the lines of wire and had the maximum widthwise length of 230 μm and the longitudinal length of 100 μm, were formed in the respective lines of wire in crossing areas where the ends of the cover-side opening/the base-side opening and the lines of wire are crossed each other, two for each line of wire.

Thereafter, the plating resist was removed by chemical etching and then the thin chromium film and the thin copper film on which the plating resist had been formed were removed by chemical etching.

Sequentially, a rigid, thin nickel film having thickness of 0.1 μm was formed on the surface of the conductive pattern and the surface of the stainless steel foil by the electroless nickel plating. Thereafter, a liquid solution of a precursor of the photosensitive polyimide resin was applied on the thin nickel film and the base layer and then heated at 130° C. to thereby form a coating of the precursor of the photosensitive polyimide resin (Cf. FIG. 16(f)). Sequentially, the coating was exposed to light (405 nm, 1,500 mJ/cm$^2$) through the photomask (Cf. FIG. 16(g)). The exposed part of the coating was heated to 180° C. and then developed by using an alkaline developer, whereby the coating was patterned so that the conductive layer could be covered with the coating (Cf. FIG. 16(h)). Sequentially, the patterned coating of the precursor of photosensitive polyimide resin was heated at 350° C. to be cured (imidized), whereby the cover layer comprising polyimide resin of thickness of 3 μm was formed on the conductive layer (FIG. 16(i)).

It is to be noted that in forming the cover layer, the cover-side openings were formed in the cover layer so that when the cover layer was patterned, the thin nickel film on the conductive pattern at its part at which the external-side connecting terminals are to be formed could be exposed.

Sequentially, the external-side connecting terminals were formed in the state in which their both sides were exposed. First, the supporting-board-side openings larger than the cover-side openings were formed in the stainless steel foil at its portions corresponding to the cover-side openings so that the base layer could be exposed (Cf. FIG. 16(j)). The supporting-board-side openings were formed in the process that after all of the areas of the stainless steel foil, except the areas in which the supporting-board-side openings are to be formed, were subjected to masking, the stainless steel foil was subjected to the chemical etching. At the same time as the formation of the supporting-board-side openings, the gimbals were cut into a predetermined shape by the chemical etching.

Sequentially, the thin nickel film as was exposed in the cover-side openings was peeled and the thin nickel film formed on the stainless steel foil was peeled.

Then, the base layer exposed in the supporting-board-side openings of stainless steel foil were opened and thereby the base-side openings were formed to expose the ground formed on the back side of the conductive pattern (Cf. FIG. 16(k)). The base-side openings were formed by the plasma etching. In the plasma etching, with the stainless steel foil as the mask, the entire base layer exposed in the supporting-board-side openings of the stainless steel foil was etched for about 2 minutes in the conditions of: the mixed gas of $CF_4$ and $O_2$ ($CF_4/O_2=20/80$) used as the gas filled; the gas pressure (degree of vacuum) of 25 Pa; the frequency of 13.5 MHz; and the power required for the plasma etching of 2,500 W.

The base-side openings thus formed were formed in the same size and shape as the supporting-board-side openings, and the space of about 50 μm was defined between the periphery of the ground exposed in the base-side openings and the periphery of the base-side opening/supporting-board-side opening.

Thereafter, the ground exposed in the base-side openings were peeled to expose the back side of the conductive pattern. Sequentially, the metal plated layers were formed by performing the electrolysis nickel plating and the electrolysis gold plating being alternately, so that the nickel plated layers having thickness of 2 μm and the gold plated layer having thickness of 1 μm were formed on the both sides of the conductive pattern thus exposed (FIG. 16(l)).

The metal plated layers on the back side of the conductive pattern thus formed left the thicknesswise interval of ±2 μm between the front side of the metal plated layers and the interface between the base layer and the stainless steel foil and also left the interval of 47 μm between the periphery of the metal plated layer and the periphery of the base-side opening/the supporting-board-side opening.

After these processes, the suspension board with circuit was obtained in which the external connecting terminals were presented in the form of the flying lead of the conductive pattern in which the widened portions were formed in the lines of wire, respectively (Cf. FIG. 15).

Example 2

The suspension board with circuit having the external-side connecting terminals produced in the form of the flying lead of the conductive pattern whose lines of wire were covered with the base-side projections at their exposed ends was produced (FIG. 20) in the same operation as in Example 1, except that instead of forming the widened portions in the lines of wire of the conductive pattern, the base-side projections of generally triangle as viewed from the top having the basal width of 110 μm and the projection length of 200 μm were formed in the base layer in the crossing areas (two areas per each line of wire) where the ends of the base-side opening and the lines of wire cross each other, so as to project from the ends of the base-side opening onto the conductive pattern in the base-side opening in the process of opening the base layer to form the base-side openings (Cf. FIG. 16(k)).

Comparative Example 1

Except that no widened portions were formed in the lines of wire of the conductive pattern, the suspension board with circuit having the external-side connecting terminals presented in the form of the flying lead was produced (Cf. FIG. 21) in the same operation as in Example 1.

Evaluation

After being bonded to the external terminals comprising gold pads by applying supersonic vibration thereto by use of the bonding tool, the external-side connecting terminals of the suspension boards with circuit obtained in Examples 1 and 2 and Comparative Example 1 were put to the peel tests to measure the bonding strength.

The test results are shown in Table 1 given below. It should be noted that all destructions occured in the conductive patterns of the suspension boards with circuit of Examples 1 and 2 took place in the areas where the conductive pattern was covered with the cover layer and the base layer.

TABLE 1

|  | Example 1 | Example 2 | Comparative Example 1 |
|---|---|---|---|
| Bonding strength in peel test (mN) | 540 | 590 | 490 |

While illustrative embodiments of the present invention are provided in the above description, such is for illustrative purpose only and is not to be construed restrictively. Modification and variation of the present invention that will be obvious to those skilled in the art is to be covered by the following claims.

What is claimed is:

1. A wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein at least any one of the first insulating layer, the second insulating layer and the conductive pattern has reinforcing portions for reinforcing the conductive pattern formed at the ends of the opening in crossing areas where ends of the opening and the conductive pattern cross each other.

2. The wired circuit board according to claim 1, wherein the wired circuit board is a suspension board with circuit.

3. A wired circuit board comprising a first insulating layer, a conductive pattern formed on the first insulating layer, a second insulating layer formed on the conductive pattern, and an opening, formed at the same position of the conductive pattern, for allowing the first insulating layer and the second insulating layer to open, so as to form a terminal portion in which front and back sides of the conductive pattern are exposed, wherein the conductive pattern has widened portions formed to extend in a widthwise direction substantially orthogonal to an extending direction of the conductive pattern in crossing areas where ends of the opening and the conductive pattern cross each other.

4. A wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein the conductive pattern has widened portions formed to extend in widthwise direction substantially orthogonal to an extending direction of the conductive pattern in crossing areas where ends of the opening and the conductive pattern cross each other.

5. The wired circuit board according to claim 4, wherein the wired circuit board is a suspension board with circuit.

6. A wired circuit board comprising a metal supporting layer, a first insulating layer formed on the metal supporting layer, a conductive pattern formed on the first insulating layer, a second insulating layer formed on the conductive pattern, and an opening, formed at the same position of the conductive pattern, for allowing the metal supporting layer and the first insulating layer, and the second insulating layer to open, so as to form a terminal portion in which front and back sides of the conductive pattern are exposed, wherein at least one of the first insulating layer and the second insulating layer have projections projecting from ends of the opening onto the conductive pattern in the opening in the crossing areas where the ends of the opening and the conductive pattern cross each other.

7. The wired circuit board according to claim 6, wherein the red circuit board is a suspension board with circuit.

* * * * *

UNITED STATES PATENT AND TRADEMARK OFFICE
CERTIFICATE OF CORRECTION

PATENT NO. : 6,841,737 B2
DATED : January 11, 2005
INVENTOR(S) : Makoto Komatsubara et al.

It is certified that error appears in the above-identified patent and that said Letters Patent is hereby corrected as shown below:

Column 1,
Line 4, replace "2001-21812" with -- 2001-216812 --.

Column 24,
Line 63, replace "red" with -- wired --.

Signed and Sealed this

Seventeenth Day of May, 2005

JON W. DUDAS
*Director of the United States Patent and Trademark Office*